United States Patent [19]
Saito et al.

[11] Patent Number: 5,280,181
[45] Date of Patent: Jan. 18, 1994

[54] QUANTUM SEMICONDUCTOR DEVICE THAT USES A QUANTUM POINT CONTACT FOR PRODUCING A QUANTUM MECHANICAL CARRIER WAVE WITH DIRECTIVITY

[75] Inventors: Miyoshi Saito, Kanagawa; Toshihiko Mori, both of Kawasaki, Japan

[73] Assignee: Fujitsu Limited, Kawasaki, Japan

[21] Appl. No.: 892,377

[22] Filed: Jun. 3, 1992

[30] Foreign Application Priority Data

Jun. 4, 1991 [JP] Japan .................................. 3-132712
Jun. 20, 1991 [JP] Japan .................................. 3-148710

[51] Int. Cl.⁵ ...................... H01L 27/12; H01L 45/00
[52] U.S. Cl. ...................................... 257/24; 257/14; 257/29; 257/195; 257/472
[58] Field of Search ................ 257/14, 29, 192, 195, 257/472, 24

[56] References Cited

U.S. PATENT DOCUMENTS 4,962,410 10/1990 Kriman et al. ........................ 257/472
4,996,570 2/1991 Van Houten et al. ............... 257/194
5,051,791 9/1991 Baldwin et al. .

OTHER PUBLICATIONS van Wees, "Quantized Conductance of Point Contacts in a 2–Dimensional Electron Gas", Phys. Rev. Lett., vol. 60, #9, Feb. 29, 1988, pp. 848–850.
Spector et al., "Refractive Switch for Two–Dimensional Electrons", App. Phys. Lett., vol. 56, #24, Jun. 11, 1990, pp. 2433–2435.
Okada et al., Superlattices and Microstructures, vol. 10,
No. 4, 1991 "Angular Distribution of Electrons Injected Through a Quantum Point Contact".
Patent Abstracts of Japan, vol. 14, No. 170 (E–913) Mar. 30, 1990 & JP–A–20 27 739 (NIT) Jan. 30, 1990, Abstract.

*Primary Examiner*—William Mintel
*Assistant Examiner*—Mahshid Saadat
*Attorney, Agent, or Firm*—Armstrong, Westerman, Hattori, McLeland & Naughton

[57] ABSTRACT

A quantum semiconductor device comprises a channel region formed with a two-dimensional carrier gas, a Schottky electrode structure provided on the channel region for creating a depletion region in the channel region to extend in a lateral direction such that the two-dimensional carrier gas is divided into a first region and a second region, a quantum point contact formed in the depletion region to connect the first and second regions of the two-dimensional carrier gas in a longitudinal direction, an emitter electrode provided on the channel region in correspondence to the first region of the two-dimensional carrier gas, one or more collector electrodes provided on the channel region in correspondence to the second region of the two-dimensional carrier gas, and another Schottky electrode structure provided in correspondence to the first region for creating a depletion region therein such that a path of the carriers entering into the quantum point contact is controlled asymmetrical with respect to a hypothetical longitudinal axis that passes through the quantum point contact in the longitudinal direction.

13 Claims, 17 Drawing Sheets

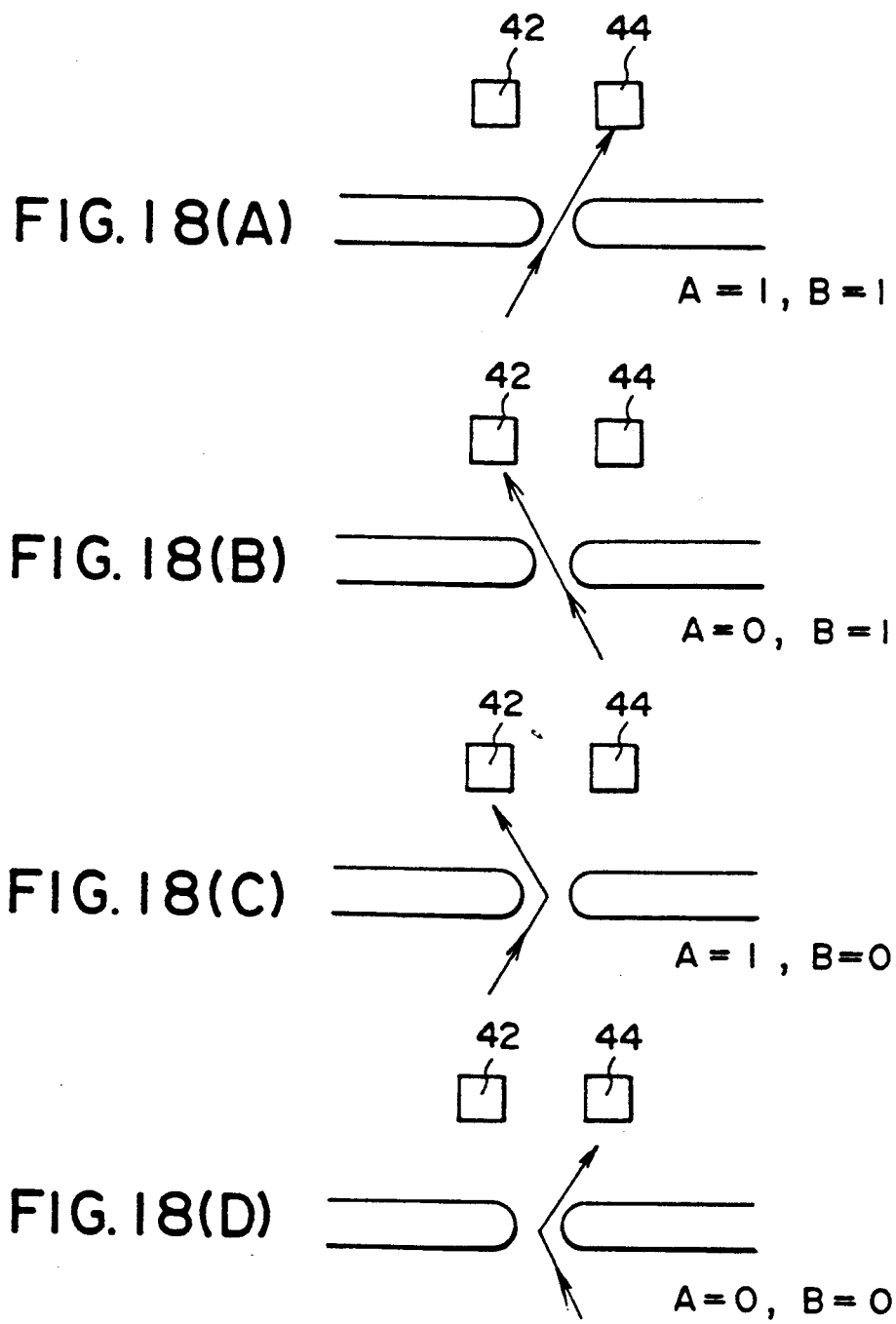

FIG. 19

| A | B | f$_1$ | f$_2$ |
|---|---|---|---|
| 1 | 1 | 0 | 1 |
| 0 | 1 | 1 | 0 |
| 1 | 0 | 1 | 0 |
| 0 | 0 | 0 | 1 |

QUANTUM SEMICONDUCTOR DEVICE THAT USES A QUANTUM POINT CONTACT FOR PRODUCING A QUANTUM MECHANICAL CARRIER WAVE WITH DIRECTIVITY

BACKGROUND OF THE INVENTION

The present invention generally relates to semiconductor devices and more particularly to a quantum semiconductor device that uses a quantum point contact for producing a quantum mechanical carrier wave with directivity.

Recent development of epitaxial processes such as MBE or MOCVD has enabled the growth of substantially defect-free crystals. In such high quality crystals, the mean-free path of the carriers has been increased significantly. For example, the electrons can now be transported ballistically for a length of as much as 10 $\mu$m without experiencing substantial scattering. On the other hand, the progress of fine lithographic patterning technology has enabled the fabrication of semiconductor devices that have a device pattern substantially smaller than 1 $\mu$m. For example, the currently available patterning process can form a device structure wherein the carriers such as electrons or holes are confined in a submicron region having a lateral size in the order of 0.1 $\mu$m. When the carriers are confined in such a small region the size of which is comparable to the de Broglie length, the wave nature of carriers becomes conspicuous.

Thus, intensive efforts are being made to realize the so-called quantum semiconductor devices that use the wave nature of carriers positively for the device operation. It should be noted that this type of device is distinguished over the conventional quantum semiconductor devices, which confine the carriers in a thin epitaxial layer (for example, Esaki et al., IBM Research Note, RC-2418, 1969), in that the confinement of the carriers is achieved laterally by creating a depletion region. Such a depletion region is created typically by a Schottky electrode. By controlling the lateral extension of the depletion region in response to the voltage applied to the Schottky electrode, one can control the size of the region where the carriers are confined and hence the quantum levels formed therein. Thereby, the operational characteristics of the device is controlled variously.

FIG. 1 shows a conventional quantum semiconductor device proposed by the inventor of the present invention.

Referring to FIG. 1 showing the device in a plan view, the device includes a channel region 14 that has a cross sectional view substantially identical with that of a HEMT. Thus, there is formed a two-dimensional carrier gas along a heterojunction interface that characterizes the HEMT. On the upper major surface of the channel region 14, there is provided a Schottky electrode 10 that is formed with a gap 12, and a depletion region 16 is formed in correspondence to the Schottky electrode 10 as indicated by a broken line. There, the depletion region 16 is interrupted in correspondence to the gap 12 and there is formed a passage of the carriers in correspondence to the gap 12 with a lateral extension L that changes in response to the electric voltage applied to the electrode 10. The lateral extension L is set approximately equal to or smaller than the de Broglie length of the carriers, and there are formed discrete quantum levels in the passage of the carriers. On the other hand, the passage has a length, measured perpendicularly to the elongating direction of the electrode 10, such that the length is set smaller than any of the elastic and inelastic scattering lengths of the carriers. Thereby, the passage forms a quantum point contact as reported by Van Wees et al. (Van Wees, B. J., et al., Physical Review Letters, Vol. 60, No. 9, 1988).

The quantum point contact is supplied with carriers, and each carrier thus supplied behaves as a quantum mechanical wave in the quantum point contact because of the lateral carrier confinement. Thereby, the carriers are emitted from the quantum point contact in the form of the quantum mechanical wave that is characterized by a directional radiation pattern, wherein the directivity of the radiation pattern is changed in response to the lateral extension L of the quantum point contact.

In order to supply the carriers to the quantum point contact, there is provided an emitter electrode 2 on the upper major surface of the channel region 14, while there are provided collector electrodes 4, 6 and 8 in contact with the upper major surface of the channel region 14 for collecting the carriers that have been emitted from the quantum point contact. By controlling the directivity of the radiation pattern in response to the electric voltage that is applied to the Schottky electrode 10, one can control the operational conditions of the device, between a first state wherein the electrode 6 detects the carriers and a second state wherein the electrodes 4 and 8 detect the carriers.

FIGS. 2(A) and 2(B) show the principle of formation of the quantum mechanical carrier wave in the quantum point contact for two different settings of the size L of the quantum point contact. As already explained, there are formed discrete quantum levels in the quantum point contact as a result of the lateral confinement of the carriers. In the description below, the x-y coordinate system defined in FIG. 1 will be employed.

Referring to FIG. 2(A) showing the case where the size L of the quantum point contact is set small enough such that quantum level $E_1$ corresponding to the ground state of the discrete quantum levels is formed below the Fermi energy $E_F$ of the incident carriers such that the Fermi energy $E_F$ is located above the quantum level $E_1$ but below the quantum level of a higher quantum state, there appears a wave function $\phi_1(y)$ in correspondence to the quantum level $E_1$ wherein the wave function $\phi_1(y)$ is represented by a symmetric function such as $A \cdot \cos(\pi \cdot y/L)$ in correspondence to the standing wave formed in the quantum point contact, where A is a constant. Thereby, the wave function $\phi_1(y)$ has a node at both ends in correspondence to the lateral boundaries of the quantum point contact. Further, the wave function $\phi_1(y)$ has an antinode in correspondence to the central part thereof. Thus, the carrier wave for this mode lacks the component that propagates in the y-direction and the incident electron beam propagates through the quantum point contact straight in the x-direction with a wave vector $k_{x1}$ that is given by $$\hbar^2 k_{x1}^2 / 2m^* = (E_F - E_1), \qquad (1)$$

where $\hbar$ represents the Planck's constant divided by $2\pi$ and $m^*$ represents the effective mass of the carrier particle.

In the case where the size of the quantum point contact is increased to L' as shown in FIG. 2(B), the Fermi level $E_F$ for the incident carriers is located above a quantum level $E_2$ that is formed above the quantum level $E_1$ as a higher order quantum state. In correspondence to the quantum level $E_2$, there appears a wave function $\phi_2(y)$ that is represented by an asymmetric function such as $A \cdot \sin(2\pi \cdot y/L)$ in correspondence to the higher order harmonics. There, the wave function $\phi_2(y)$ includes a node at the central part thereof, and the phase of the wave function changes by 180 degrees across the central node. It should be noted that such an inversion of the phase indicates that there exits a wave component propagating in the y-direction in the mode of FIG. 2(B), in addition to the component that propagates in the x-direction. There, the wave vector $k_{x2}$ for the x-component satisfies a relationship $$\hbar^2 = k_{x2}^2/2m^* = E_F - E_2, \quad (2)$$
$$\hbar^2 = k_{y2}^2/2m^* = E_2$$

wherein the wave vector $k_{y2}$ is determined by the size $L'$ of the quantum point contact. When the wave vector $k_y$ is determined, the wave vector $k_x$ is determined by Eq. (2). Thereby, the carrier wave exits from the quantum point contact and travels away therefrom while maintaining the waveform of the wave function $\phi_2(y)$.

It should be noted that the device of FIG. 1 has the collector electrode 6 provided in alignment with the quantum point contact for detecting the carriers that have passed through the quantum point contact with the ground state shown in FIG. 2(A). On the other hand, the collector electrodes 4 and 8 are provided for detecting the carrier waves for the second quantum state shown in FIG. 2(B). It should be noted that the carrier waves corresponding to the wave function $\phi_2(y)$ are emitted in two directions that are symmetrical with respect to the x-axis.

By applying an input voltage to an input terminal IN connected to the Schottky electrode 10 with a voltage level adjusted suitably, it is possible to realize the state shown in FIG. 2(A). Thereby, an output signal is obtained at an output terminal OUT1 that is connected to the collector electrode 6. When the voltage to the Schottky electrode 10 is set to a second voltage that is adjusted to realize the state shown in FIG. 2(B), an output signal is obtained at an output terminal OUT2 that is connected to the collector electrodes 4 and 8.

FIG. 3 shows the angular radiation profile of the carrier wave that is generated by the quantum point contact, wherein the broken line designated as $F_1$ corresponds to the radiation formed by the wave function $\phi_1$ while the two broken lines designated as $F_2$ correspond to the radiation formed by the wave function $\phi_2$. It will be noted that only the profile of $F_1$ is obtained when the device is biased as shown in FIG. 2(A), while the radiation patterns $F_1$ and $F_2$ overlap with each other when the device is biased as shown in FIG. 2(B). Thereby, the overall output profile of the device in the biasing state of FIG. 2(B) is represented by the continuous line shown in FIG. 3 (Okada et al., "Angular Distribution of Electrons Injected Through A Quantum Point Contact" *Superlattice and Microstructures*, Vol. 10, No. 4, 1991). From FIG. 3, it will be noted that the change of the output signal between the state of FIG. 2(A) and the state of FIG. 2(B) is relatively small due to the overlapping of the radiation profiles $F_1$ and $F_2$. Thereby, there exists a substantial difficulty in constructing a logic circuit based upon the device of FIG. 1.

SUMMARY OF THE INVENTION

According, it is a general object of the present invention to provide a novel and useful quantum semiconductor device wherein the foregoing problems are eliminated.

Another and more specific object of the present invention is to provide a quantum semiconductor device that shows a clear change of the radiation pattern of the quantum mechanical wave of carriers, in response to the change of an input signal.

Another object of the present invention is to provide a logic device that achieves a logic operation in response to a change in the radiation pattern of a quantum mechanical wave of carriers emitted from a quantum point contact.

Another object of the present invention is to provide a quantum semiconductor device comprising a channel region formed therein with a two-dimensional carrier gas, said two-dimensional carrier gas comprising carriers confined substantially on a plane that extends in a lateral direction and in a longitudinal direction; a barrier means provided on said channel region to extend in said lateral direction for dividing said channel region into a first channel area and a second channel area such that said first channel area and said second channel area are separated from each other in said longitudinal direction, said barrier means producing a depletion region to extend in said lateral direction in correspondence to said barrier means such that the depletion region divides said two-dimensional carrier gas into a first carrier gas region corresponding to said first channel area and a second carrier gas region corresponding to said second channel area, by rejecting said carriers from said depletion region; a quantum point contact formed in said barrier region as a quantum well that connects said first carrier gas region and said second carrier gas region with each other in said longitudinal direction, said quantum well being defined laterally by said depletion region and having a lateral size less than several times the de Broglie length of said carriers in said two-dimensional carrier gas, said quantum point contact having a longitudinal size set smaller than any of the elastic and inelastic scattering lengths of said carriers in said two-dimensional carrier gas, said quantum point contact allowing a passage of the carriers in the form of a quantum mechanical wave between said first and second carrier gas regions; carrier injection means provided on said first channel area for injecting said carriers into said two-dimensional carrier gas in correspondence to said first carrier gas region; carrier collection means provided on said second channel area for collecting said carriers from said two-dimensional carrier gas in correspondence to said second carrier gas region, said carrier collection means being provided on said second channel area at a predetermined location selected for receiving said carriers that are emitted from said quantum point contact in the form of said quantum mechanical wave; and carrier injection control means provided on said first channel area between said injection means and said barrier means for controlling a path of the carriers that are injected by said carrier injection means and entering into said quantum point contact, such that the carriers enter said quantum point contact asymmetrically with respect to a longitudinal axis that is set to pass through a center of said quantum point contact in said longitudinal direction.

According to the present invention, it is possible to obtain an asymmetric angular radiation pattern for the output quantum mechanical wave of the carriers that are radiated from the quantum point contact. By controlling the carrier injection control means, one can shift the peak that characterizes the asymmetric output radiation pattern of the quantum mechanical wave from a first side of the longitudinal axis to the second side. Thereby, a large change is guaranteed in the electric signals that are obtained by the carrier collection means, and the quantum semiconductor device shows a clear transition of the state. By changing a control voltage that is applied to the barrier means for creating the depletion region in combination with the setting of the carrier injection control means, one can achieve various logic operations based upon the quantum device of the present invention.

Other objects and further features of the present invention will become apparent from the following detailed description when read in conjunction with the attached drawings.

BRIEF DESCRIPTION OF THE DRAWINGS

FIGS. 18(A)–18(D) are diagrams showing the principle of the logic operation achieved by the quantum semiconductor device of the present invention;

FIG. 19 is a truth table showing the logic operation achieved by the quantum semiconductor logic device according to the present invention;

DETAILED DESCRIPTION OF THE PREFERRED EMBODIMENTS

Figure 4:
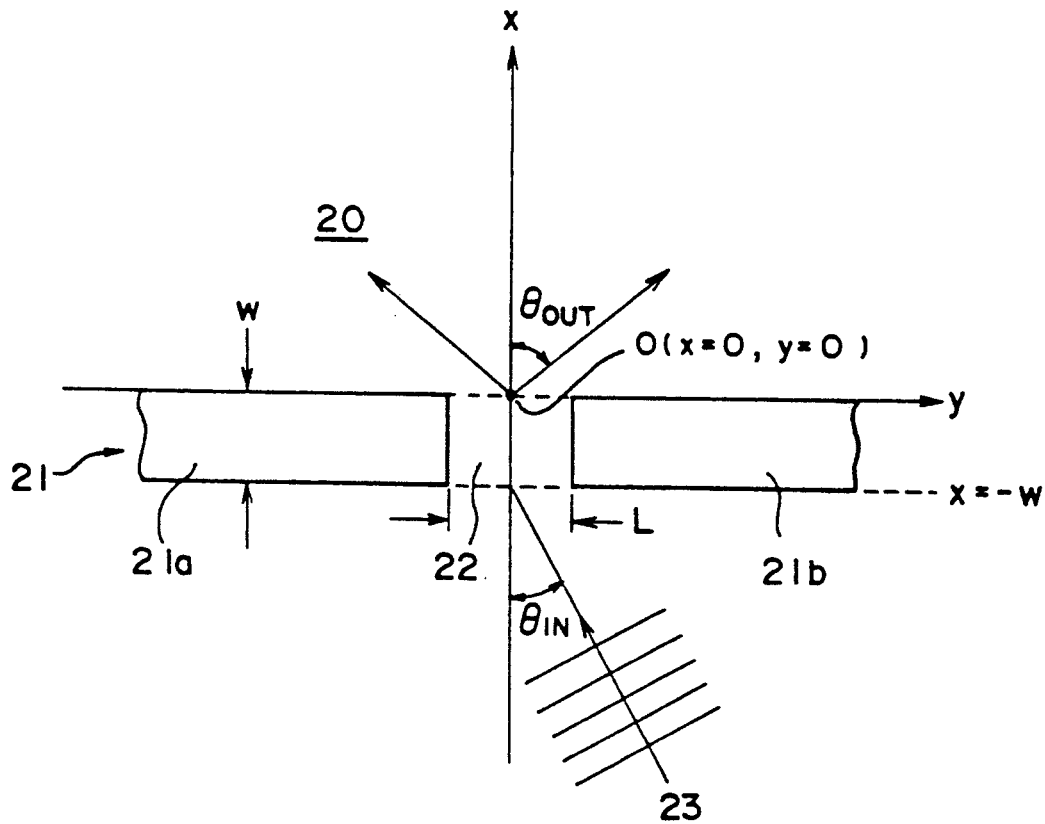
FIG. 4 is a diagram showing the principle of the quantum semiconductor device according to the present invention.

First, the principle of the present invention will be described with reference to FIG. 4 showing the radiation of the carrier wave from a quantum point contact. The following mathematical derivation is based upon Okada et al, op. cit.

Figure 1:
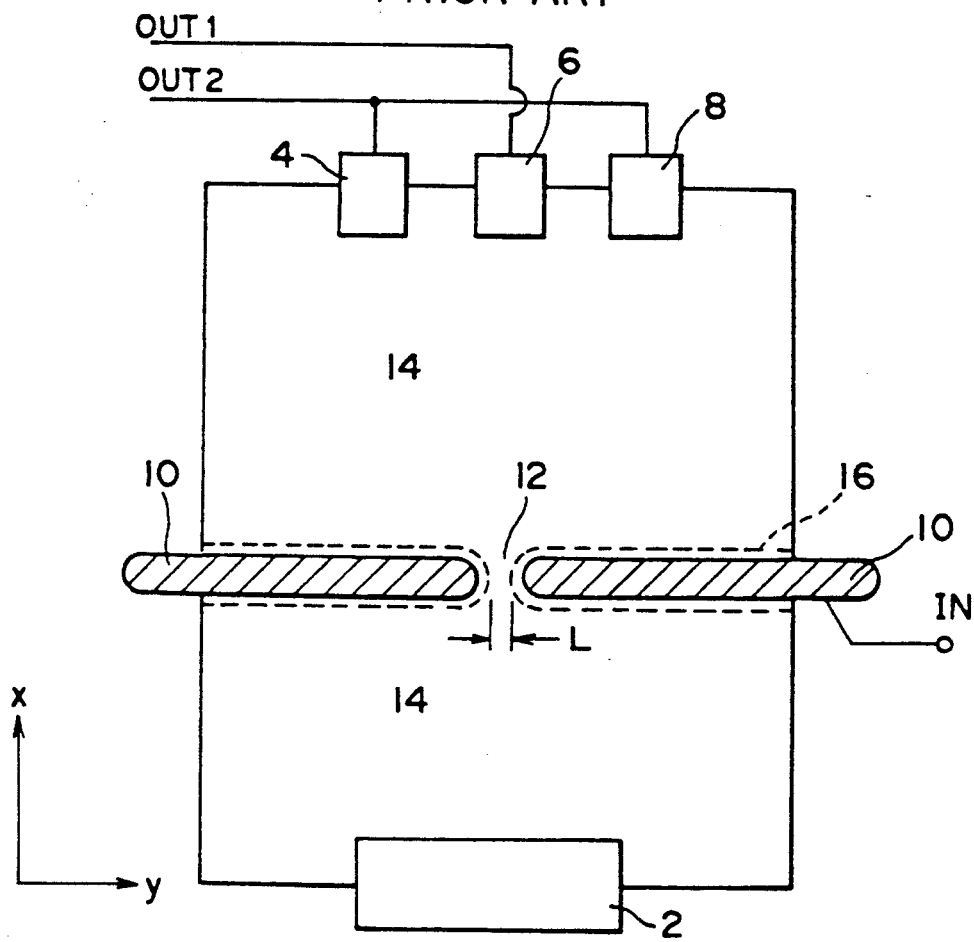
FIG. 1 is a diagram showing the construction of a conventional quantum semiconductor device in a plan view.

Referring to FIG. 4 showing a two-dimensional carrier gas 20 formed in the channel region corresponding to the channel region 14 of the device of FIG. 1, there is provided a depletion region 21 in correspondence to the Schottky electrode 10 such that the carriers such as electrons are rejected from the depletion region 21. The depletion region 21 is formed from a first part 21a and a second part 21b separated from each other by a distance L. Thereby, there is formed a quantum point contact 22 with the lateral size L.

In FIG. 4, it should be noted that a carrier wave 23 enters into the quantum point contact 22 from the lower right direction with an angle of incidence designated as $\theta_{in}$. Thereby, the wave function representing the carrier 23 wave having a wave vector $k_F$ is represented, assuming a plane wave, as $$\psi_{\theta in} = C_{\theta in} \exp\{i(x+w)(k_F \cos\theta_{in})\} \cdot \exp\{i \cdot y(k_F \sin\theta_{in})\}$$

wherein the origin O (c=0, y=0) is set coincident to the upper edge or the exit-side edge of the depletion region 21. Further, the depletion region 21 has a width of w in the x-direction as shown in FIG. 4. Thereby, the lower edge or the entrance side edge of the depletion region 21 has the x-coordinate of $-w$.

Figure 2A:
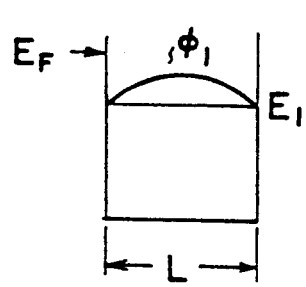
FIGS. 2(A) and (B) are diagrams showing the principle of operation of the device of FIG. 1.
Figure 2B:
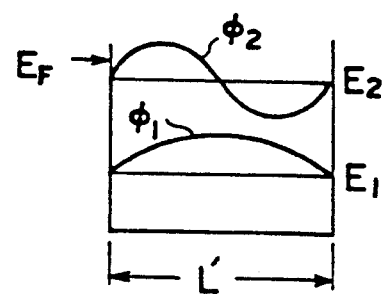

Upon entrance into the quantum point contact 22 at the entrance located at $x = -w$, the wave function of the carrier wave 23 is divided into the foregoing two modes shown in FIGS. 2(A) and 2(B) and travels in the x-direction in the form represented as $$\psi_{\theta in}(x,y) = \alpha(\theta_{in})\phi_1(y)\exp\{i \cdot k_{x1}(x+w)\} + \beta(\theta_{in})\phi_2(y)\exp\{i \cdot k_{x2}(x+w)\} \quad (4)$$

where $\alpha$ and $\beta$ are coefficients determined as a function of the angle $\theta_{in}$, while $\phi_1(y)$ and $\phi_2(y)$ are the wave functions defined before.

At the exit of the quantum point contact 22, the x-coordinate is zero ($x=0$) and the wave function of Eq. (4) is now represented as $$\psi_{EXIT}(x,y) = \alpha(\theta_{in})\phi_1(y)\exp(i \cdot k_{x1}w) + \beta(\theta_{in})\phi_2(y)\exp(i \cdot k_{x2}w). \quad (5)$$

Thereby, the carrier wave is radiated from the quantum point contact 22 under the boundary condition given by Eq. (5). More specifically, the wave function at a point $P_0$ defined at a coordinate $(r,\theta_{out})$ is represented by $$\psi_{\theta out, COLLECTOR} = \alpha(\theta_{in})\exp(i \cdot k_{x1}w)_G\Phi_1(y) + \beta(\theta_{in})\exp(i \cdot r_2)_G\Phi_2(y) \quad (6)$$

where $_G\Phi$ represents an integral given as $$_G\Phi = \int dy \cdot \Phi(y) \cdot VG_0(y,r,\theta_{out}), \quad (7)$$

in which $G_0$ is a Green function. It should be noted that the collectors 4–8 of FIG. 1 are provided in correspondence to the point $P_0$.

In the above derivation, it should be noted that the mode $\phi_1(Y)$ and the mode $\phi_2(y)$ do not cause interference in the quantum point contact 22 as these modes are in orthogonal relationship with each other in correspondence to the situation that the mode $\phi_1(y)$ and the mode $\phi_2(y)$ have respective eigen values $E_1$ and $E_2$ that are different from each other. When the carrier wave has exited from the quantum point contact, on the other hand, the confinement of the carriers that has characterized the quantum point contact disappears and the carrier wave propagates with a single mode, characterized by a single eigen value $E_F$. Thereby, the modes $_G\Phi_1(y)$ and $_G\Phi_2(y)$ are no longer orthogonal and cause an interference with each other, as the carrier wave travels away from the quantum point contact 22f The interference pattern of the carrier wave that is observed at the point $P_0$ is calculated by obtaining the probability of the carrier particle according to the relationship $$|\psi_{out, COLLECTOR}|^2 = |\alpha(\theta_{in})|^2|_G\Phi_1(y)|^2 + |\beta(\theta_{in})|^2|_G\Phi_2(y)|^2 + \{(_G\Phi_1(y))^* \cdot _G\Phi_2(y) \cdot \alpha(\theta_{in})^* \cdot \beta(\theta_{in}) \cdot \exp\{-i \cdot w \cdot (k_{x1} - k_{x2}) + c \cdot c\} \quad (8)$$

wnere * represents the complex conjugate as usual.

In Eq. (8) it should be noted that the third term cancels out when the functions $_G\Phi_1(y)$ and $_G\Phi_2(y)$ are orthogonal with each other, while the cancellation does not occur when the functions $_G\Phi_1(y)$ and $_G\Phi_2(y)$ are not orthogonal. Thus, once the carrier wave exits from the quantum point contact, the initial carrier distribution profile, given by the wave function $\psi_{EXIT}(x,y)$ of Eq. (5), provides an interference pattern as the carrier wave propagates along the channel region in the direction away from the quantum point contact.

Figure 5:
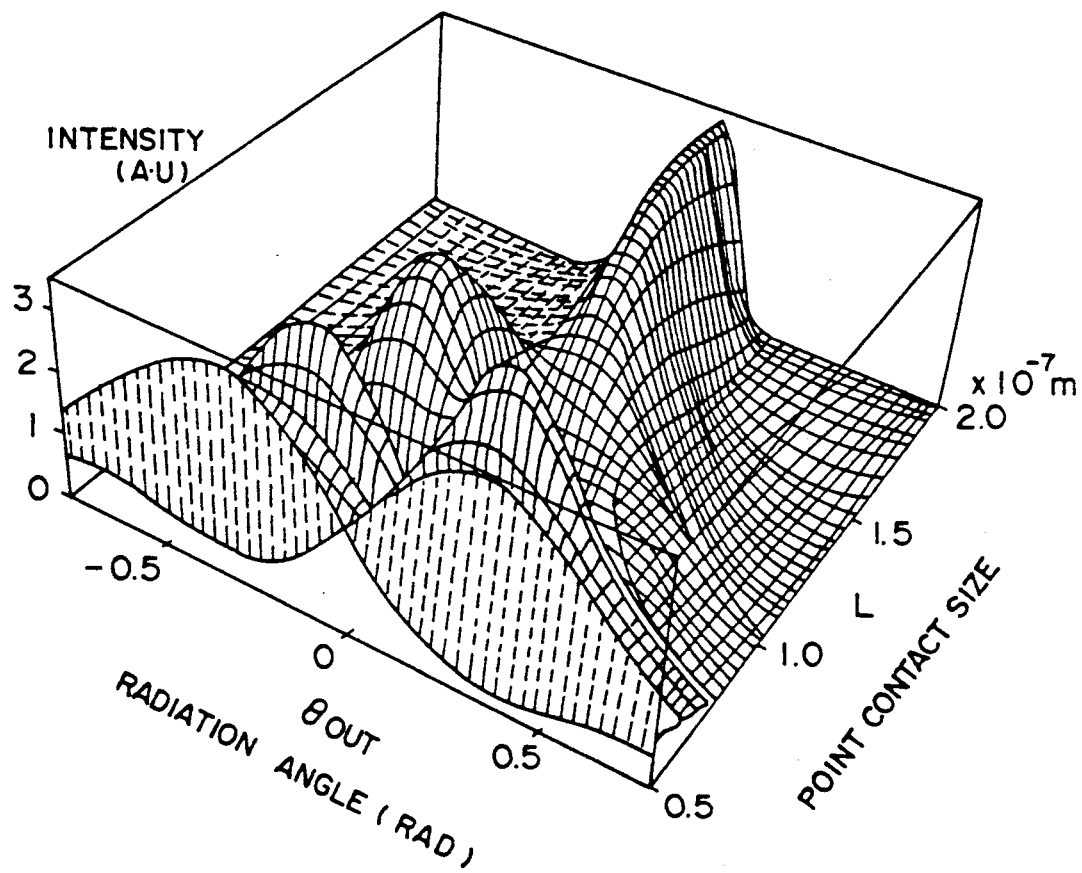
FIG. 5 is a diagram showing the radiation pattern of carrier waves that is obtained in the device of FIG. 4 for various lateral sizes of the quantum point contact.

FIG. 5 shows the radiation pattern obtained for the device of FIG. 4 for various sizes L of the quantum point contact 22 while injecting electrons into the quantum point contact from the lower right direction. It will be noted from FIG. 5 that the radiation pattern as represented by the exit angle $\theta_{out}$ changes with the setting of the size L.

From FIG. 5, it will be noted that the angle of maximum intensity of the electron wave changes alternately with respect to the axis indicating $\theta_{out}=0$ when the size L is increased. In other words, the radiation pattern of the electron waves obtained by the device of FIG. 4 is asymmetric about the axis. Another important feature of the radiation pattern shown in FIG. 5 is that the maximum or peak of the radiation intensity moves between the positive range and the negative range of the radiation angle $\theta_{out}$ when the size L of the quantum point contact is changed. This means that the directivity of the quantum point contact 22 changes when the size L of the quantum point contact is changed. In other words, there is a possibility of constructing a logic device based upon the quantum point contact shown in FIG. 4, by controlling the size L by an input voltage signal that is applied to the Schottky electrode for creating the depletion regions 21a and 21b.

Figure 6A:
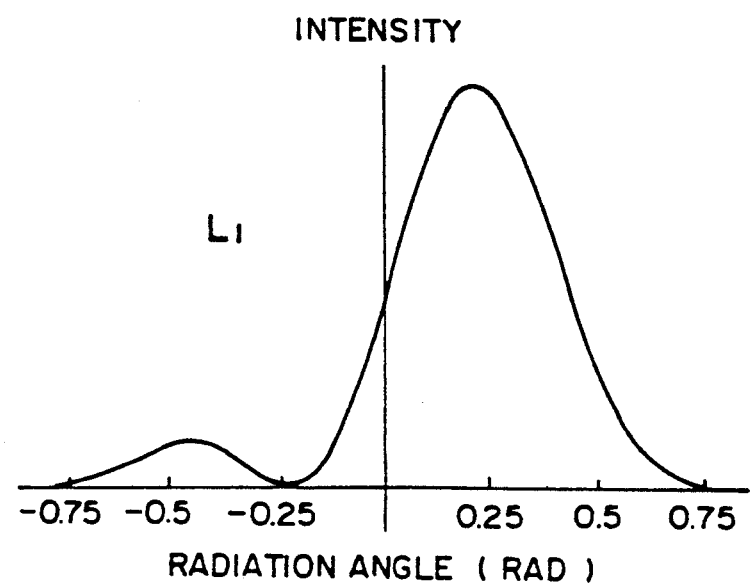
FIGS. 6(A) and 6(B) are diagrams showing the radiation pattern for the device of FIG. 4 in correspondence to various settings of the lateral size of the quantum point contact.
Figure 6B:
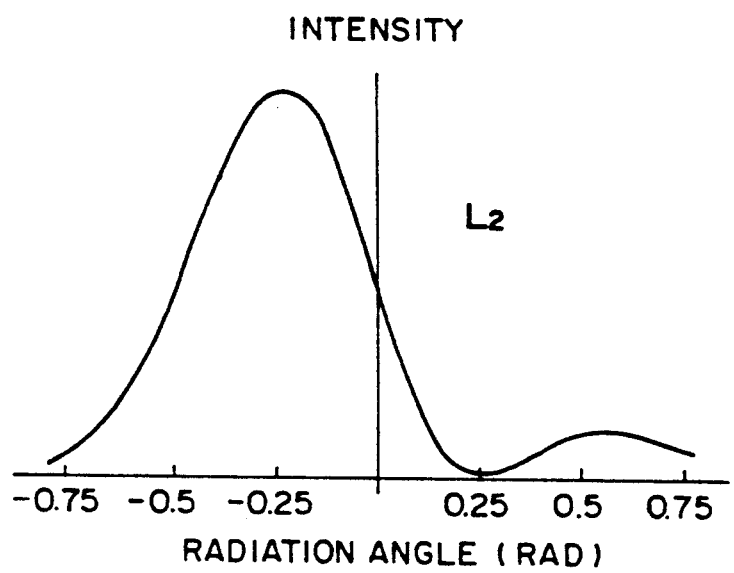

FIG. 6(A) shows the radiation pattern for a particular setting of the size L ($L_1 = 65$ nm) for the quantum point contact 22, while FIG. 6(B) shows the radiation pattern for another setting of the size L ($L_2 = 58$ nm). As can be seen clearly from FIGS. 6(A) and 6(B), the radiation pattern or the directivity of the electron wave changes significantly in response to the size of the quantum point contact 22.

Figure 7:
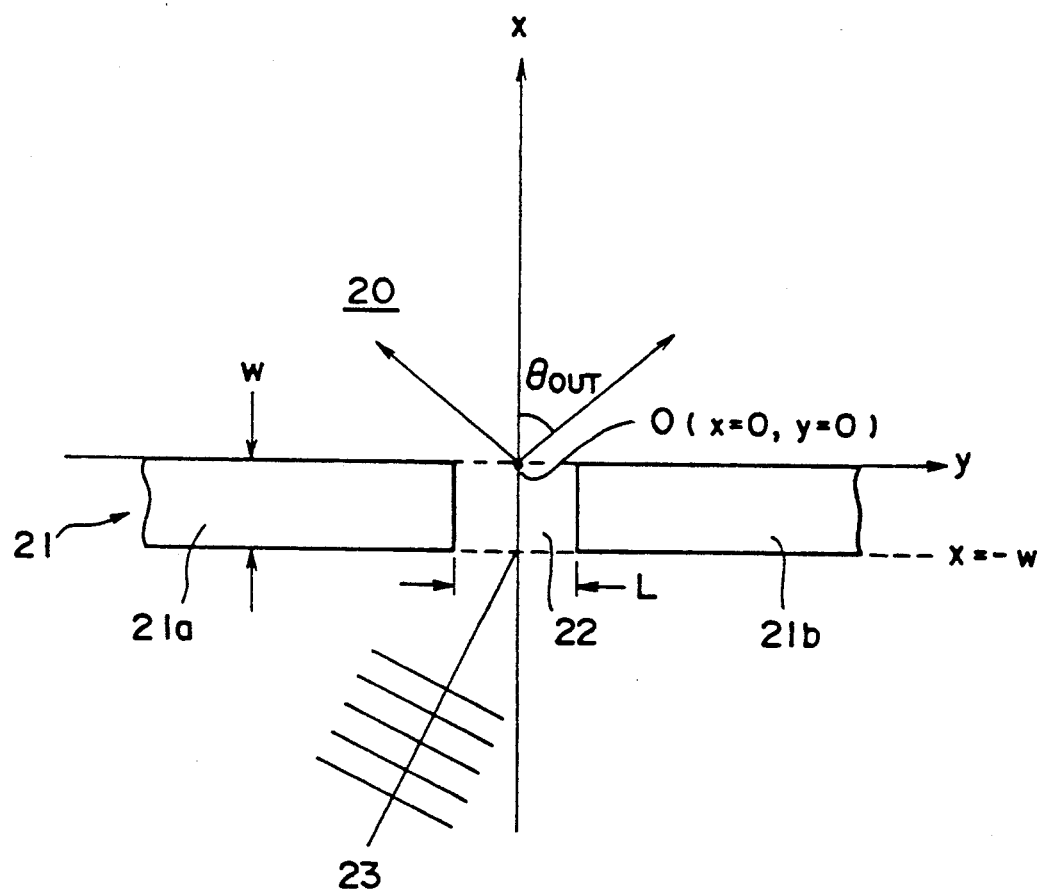
FIG. 7 is another diagram showing the principle of the quantum semiconductor device according to the present invention.

FIG. 7 shows the device of FIG. 4 in the case when the carrier wave 23 enters into the quantum point contact 22 from the lower left direction. Further, FIG. 8 shows the radiation pattern of the electron wave for the device of FIG. 7.

Figure 8:
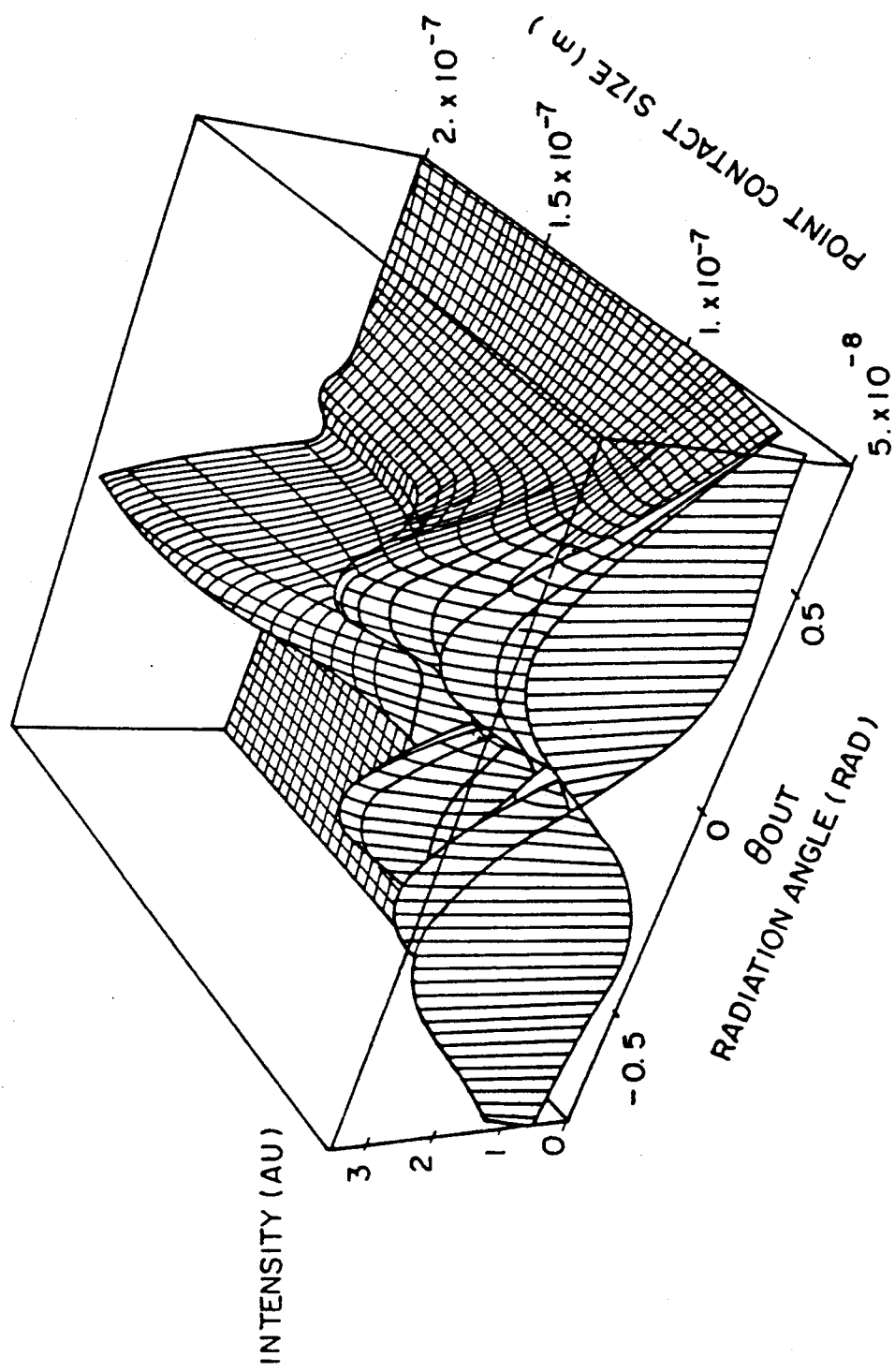
FIG. 8 is a diagram showing the radiation pattern of carrier waves that is obtained in the device of FIG. 7 for various lateral sizes of the quantum point contact.

Referring to the radiation pattern of FIG. 8, it will be noted that the radiation angle $\theta_{out}$ corresponding to a strong constructive interference, moves alternately between the positive value and the negative value of $\theta_{out}$ similarly to the radiation pattern of FIG. 5, except that the exit angle $\theta_{out}$ for the strong radiation appears at the side opposite from the radiation pattern of FIG. 5 with respect to the axis indicating $\theta_{out}=0$.

Figure 3:
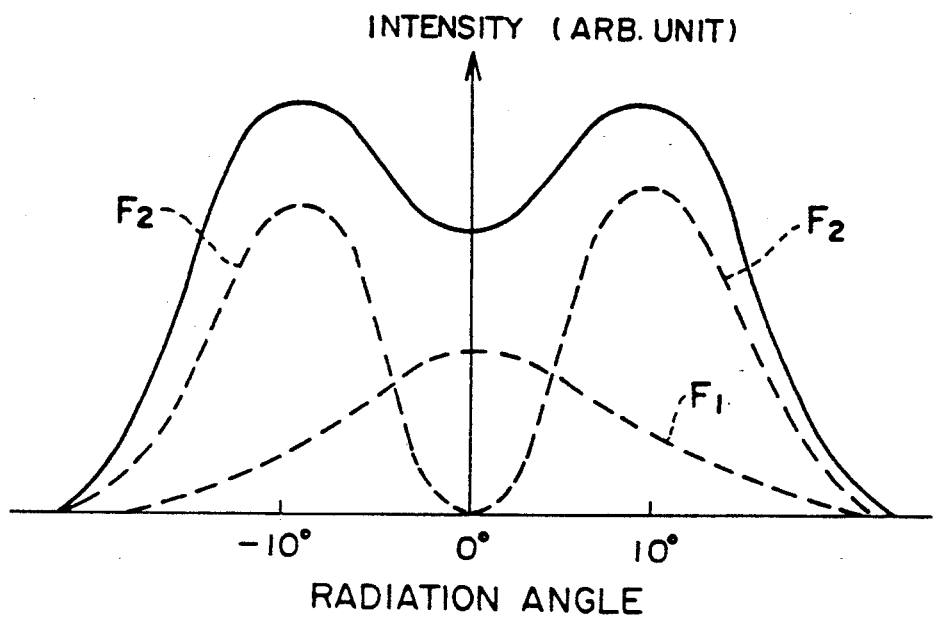
FIG. 3 is a diagram showing the radiation pattern of carrier waves that is obtained by the device of FIG. 1.

The foregoing result of FIG. 8 indicates further that the foregoing clear change of the radiation profile as shown in FIGS. 6(A) and 6(B) in the device of FIG. 4 would be inevitably obscured if the carriers were injected to the quantum point contact 22 from both the lower right direction and the lower left direction simultaneously. In such a case, the radiation profile of FIG. 6(A) and symmetric inversion thereof about the angle $\theta_{out}=0$ are overlapped with each other, resulting in a double peak pattern similar to that of the pattern $F_2$ shown in FIG. 3. In fact, it is believed that this is the reason why the conventional device of FIG. 1 has failed to show clear directivity in radiation pattern. This in turn means that, if one could eliminate the entrance of the carriers in the device of FIG. 1 from either the lower right or lower left directions, one would observe a very sharp directivity in the radiation pattern of the carrier wave that is emitted from the quantum point contact.

Figure 9:
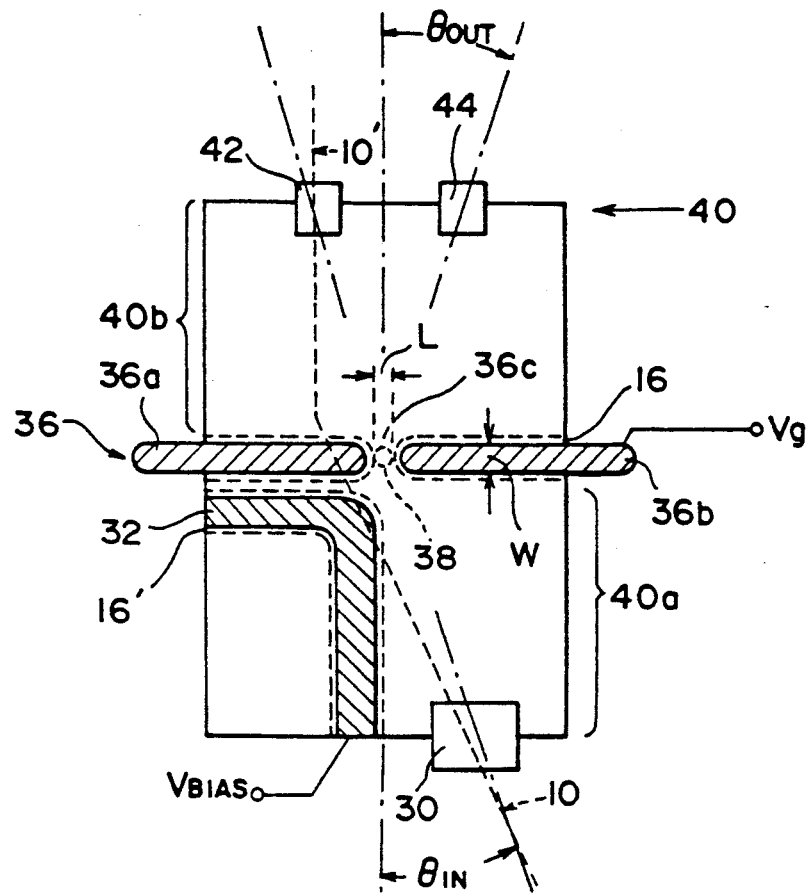
FIG. 9 is a diagram showing the quantum semiconductor device according to a first embodiment of the present invention in a plan view.
Figure 10:
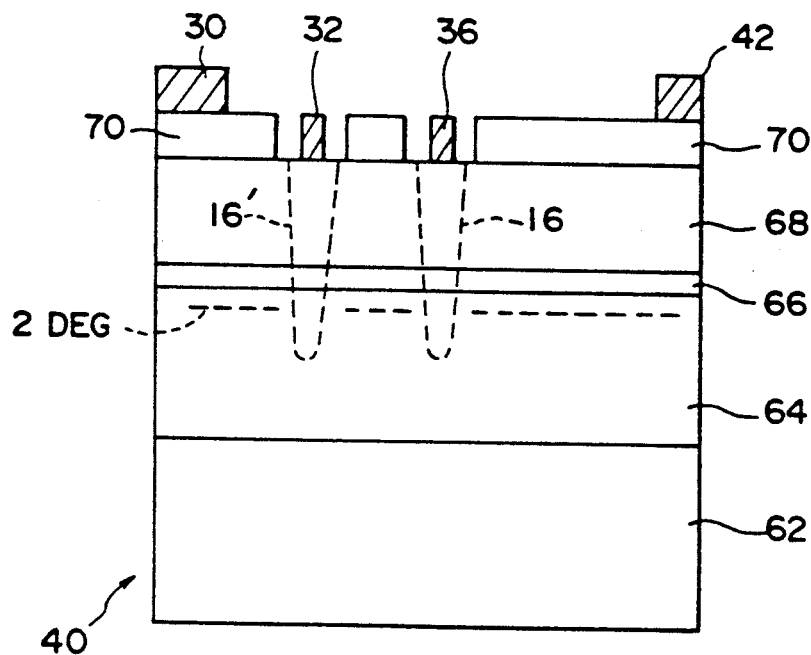
FIG. 10 is a diagram showing the quantum semiconductor device of FIG. 9 in a cross sectional view.

FIG. 9 shows a quantum semiconductor device according to a first embodiment of the present invention in plan view, while FIG. 10 shows the device of FIG. 9 in cross sectional view taken along a line 10–10' of FIG. 9.

Referring to the cross sectional view of FIG. 10 first, the quantum semiconductor device of the present embodiment is constructed on a layered semiconductor body 40 that includes a substrate 62 of semi-insulating GaAs. On the substrate 62, a channel layer 64 of undoped GaAs is grown epitaxially with a thickness of 500 nm, and an electron supplying layer 68 of n-type AlGaAs is grown epitaxially on the channel layer 64 with a thickness of 45 nm, with an intervening epitaxial layer 66 of undoped AlGaAs that is interposed between the channel layer 64 and the electron supplying layer 68 with a thickness of 10 nm. There, the electron supplying layer 68 is doped to an impurity concentration level of $1 \times 10^{18}$ cm$^{-3}$. Further, a contact layer 70 of n$^+$-type GaAs doped to the impurity concentration level of $1 \times 10^{18}$ cm$^{-3}$, is grown on the electron supplying layer 68 with a thickness of 45 nm. Thereby, there is formed a two-dimensional electron gas (2DEG) in the channel layer 64 along the upper major surface thereof with a sheet carrier density of $2.3 \times 10^{11}$ cm$^{-2}$. In the two-dimensional electron gas thus formed, a mean free path of the electrons of about 10 μm is achieved at the liquid helium temperature. The layers 64-70 may be provided by the MBE or MOCVD process as commonly practiced in the frabrication of a HEMT.

Referring now to the plan view of FIG. 9, a Schottky electrodes structure 36 including an elongate electrode element 36a and another elongate electrode element 36b is provided in contact with the upper major surface of the electron supplying layer 68 so as to divide the surface of the device into a first part 40a and a second part 40b, wherein each electrode element 36a, 36b has a width W, measured in the direction perpendicular to the elongate direction of the electrode element, of 300 nm. Further, there is formed a gap 36c between the electrode element 36a and the electrode element 36b with a size, measured in the elongate direction of the electrode elements 36a and 36b, of about 400 nm.

In correspondence to the Schottky electrode 36, there is formed a depletion region 16 that penetrates into the layered body 40, wherein depletion region 16 rejects therefromo the electrons forming the two-dimensional electron gas, similarly to the conventional device of FIG. 1. Thereby, the two-dimensional electron gas is interrupted in correspondence to the Schottky electrode elements 36a and 36b except for a quantum point contact 38 that is formed in the two-dimensional carrier gas in correspondence to the gap 36c. According to the previous notation of the device of FIG. 1, the lateral size of the quantum point contact 38 will be designated as L. Similarly to the conventional device, the extension of the depletion region 16 and hence the size L is changed as desired in response to the bias voltage that is applied to the electrodes 36a and 36b. The fabrication process of a quantum point contact is described in detail in Schmidt et al., J. Vac. Sci. Tech. B9(3) May/June 1991, which is incorporated herein as reference.

Thus, when an electron enters into the quantum point contact 38, the electron experiences a quantization and behaves as an electron wave as already discussed. Further, upon exiting from the quantum point contact 38, the electron is emitted with the radiation pattern as already explained. In order to inject the electrons into the quantum point contact 38, there is provided an emitter electrode 30 in ohmic contact with the contact layer 70 in the first part 40a, such that the electrons are injected into the two-dimensional electron gas via the electron supplying layer 68 and travel toward the quantum point contact 38. Further, in order to detect the electrons that are radiated from the quantum point contact 38 and travel along the two-dimensional electron gas, collector electrodes 42 and 44 are provided in ohmic contact with the contact layer 70 in the second part 40b, for collecting the electrons from the two-dimensional electron gas via the electron supplying layer 68.

In the device of FIG. 9, it should be noted that the collector electrodes 42 and 44 are provided in correspondence to the predicted maximum intensity of the electron wave that is radiated from the quantum point contact 38. Thus, the collector electrodes 42 and 44 may be provided with the exit angle $\theta_{out}$ of $+0.25$ radian and $-0.25$ radian in correspondence to FIGS. 6(A) and 6(B). In order to observe the clear radiation pattern, the distance between the quantum point contact 38 and the collector electrode 42 and 44 is set smaller than 10 μm in correspondence to the mean free path of the electrons in the two-dimensional electron gas.

Figure 11:
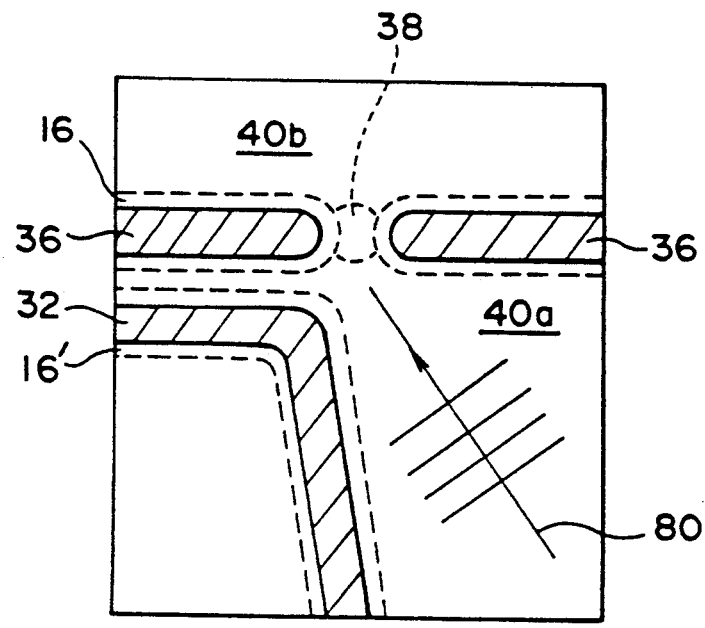
FIG. 11 is a diagram showing the operation of the quantum semiconductor device of FIG. 9.

Further, it should be noted that the emitter electrode 30 is provided with an offset to the right in the plan view with respect to the x-axis ($\theta_{in}=0$), such that the electrons that are injected into the two-dimensional electron gas enter into the quantum point contact 38 with a positive angle of incidence ($\theta_{in} > 0$). In addition, the device of FIG. 9 includes a second Schottky electrode 32 that is provided on the upper major surface of the electron supplying layer 68 in correspondence to the left half of the first part 40a, such that there is formed a depletion region 16' in correspondence to the electrode 32. When the electrode 32 is biased properly by a bias voltage $V_{BIAS}$, the incidence of the electrons into the quantum point contact 38 from the lower left direction can be totally eliminated. Thereby, the electrons enter into the quantum point contact exclusively from the lower right direction in the plan view as indicated by an electron wave 80 in FIG. 11, and the device shows the asymmetric radiation pattern as represented in FIGS. 6(A) and 6(B). As already noted therein, the pattern of FIG. 6(A) and the pattern of FIG. 6(B) appear alternately when the size L of the quantum point contact 38 is changed gradually.

It should be noted that the depletion region 16' is formed without the bias voltage $V_{BIAS}$ when the electrode 32 is provided directly on the electron supplying layer 68, although it is preferable to provide the bias voltage $V_{BIAS}$. When the electrode 32 is provided on the contact layer 70, on the other hand, such a bias voltage $V_{BIAS}$ has to be provided in order to create the depletion region 16'.

Figure 12:
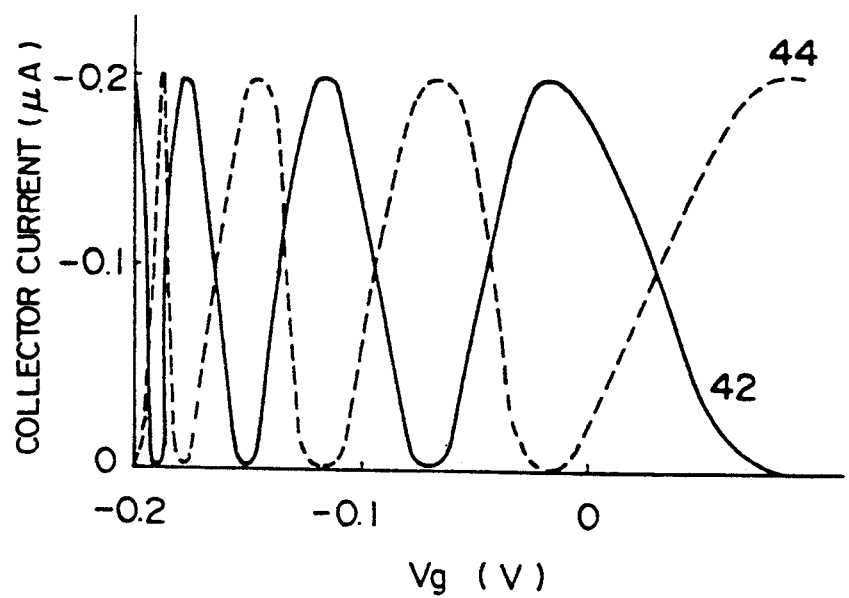
FIG. 12 is a diagram showing the operational characteristics of the quantum semiconductor device of FIG. 9.

FIG. 12 shows the collector current detected in the device of FIG. 9 by the collector electrodes 42 and 44 for various bias voltages $V_g$ applied to the Schottky electrode elements 36a and 36b, wherein the continuous line reperesents the collector current detected by the electrode 42 while the broken line represents the collector current detected by the electrode 44. As can be seen in FIG. 12, the collector current at the collector electrode 42 and the collector current at the collector electrode 44 change alternately in the range of from 0 μA to about 0.2 μA when the bias voltage $V_g$ is changed from $-0.2$ volts to 0 volt. In FIG. 12, it should be noted that an emitter-collector bias voltage $V_{EC}$ of 1.2 millivolts is applied across the emitter electrode 30 and the collector electrode 42 or 44.

In the embodiment of FIG. 9, it should be noted that the Schottky electrodes 32 and 36 may be provided directly on the contact layer 70. Further, there is no particular limitation in the distance between the quantum point contact 38 and the emitter electrode 30. The emitter electrode 30 as well as the collector electrodes 42 and 44 may be provided by an alternate stacking of a Au-Ge alloy layer and a Au layer with respective thicknesses of 20 nm and 200 nm, as is practced commonly in the art. The quantum present embodiment operates at an extremely high semiconductor device of the speed because of the ballistic transport of the electrons from the quantum point contact to the collector electrode. Further, the device consumes little electric power as the device operates based upon the control of the phase of the electron wave that passes through the quantum point contact.

Figure 13:
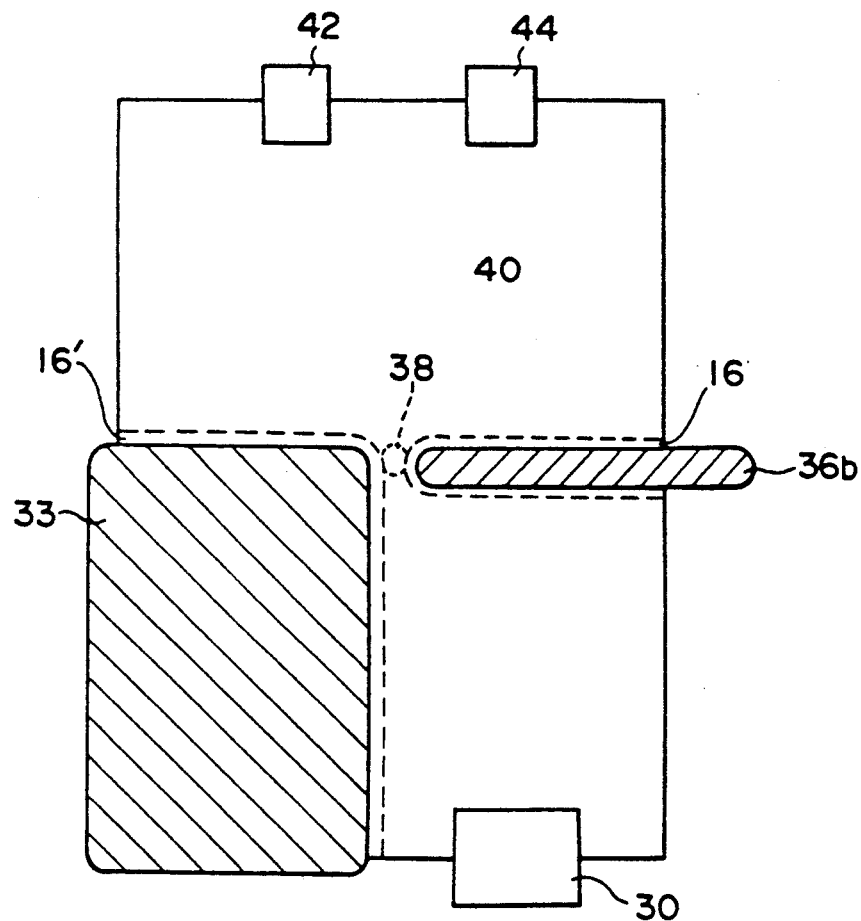
FIG. 13 is a diagram showing the quantum semiconductor device according to a second embodiment of the present invention in a plan view.

FIG. 13 shows a quantum semiconductor device according to a second embodiment of the present invention. As the device of the present embodiment has substantially the same structure in cross sectional view as that of the previous embodiment, the description of the layered body 40 will be omitted.

Figure 14:
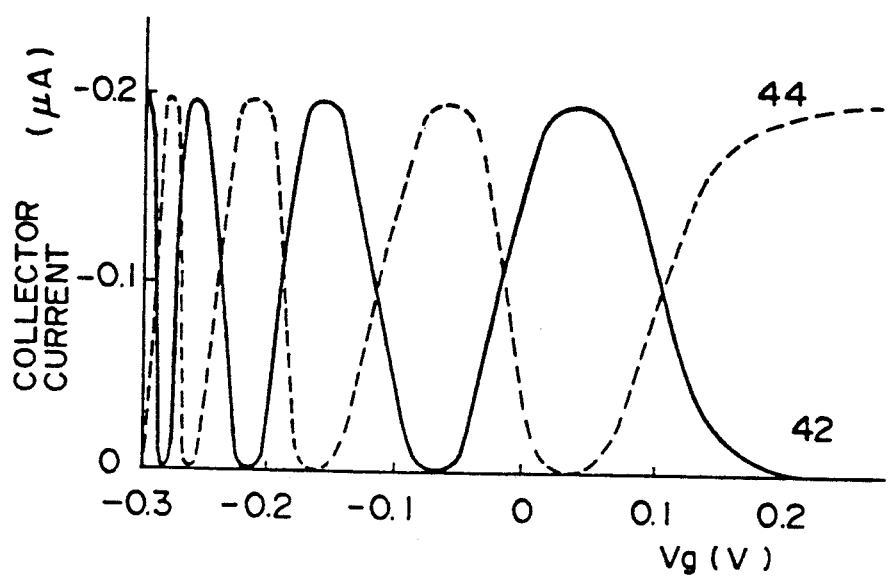
FIG. 14 is a diagram showing the operational characteristics of the quantum semiconductor device of FIG. 13.

In the present embodiment, the Schottky electrode 36a and the Schottky electrode 32 are replaced by a single Schottky electrode 33 that covers the left part of the region 40a substantially, and the quantum point contact 38 is formed between the depletion region 16' that is created by the Schottky electrode 33 and the depletion region 16 that is created by the Schottky electrode 36b. Again, the emitter electrode 30 is provided at a position offset to the right side with respect to the x-axis ($\theta_{in}=0$), and the injected electron enters into the quantum point contact 38 from the lower right direction as explained with reference to FIG. 11. In the device of the present embodiment, too, a large and clear change of the collector current can be obtained with the bias voltage $V_g$ as shown in FIG. 14, wherein an emitter-collector bias voltage $V_{EC}$ of 1.2 millivolts is used in the characterstics of FIG. 14.

Figure 15:
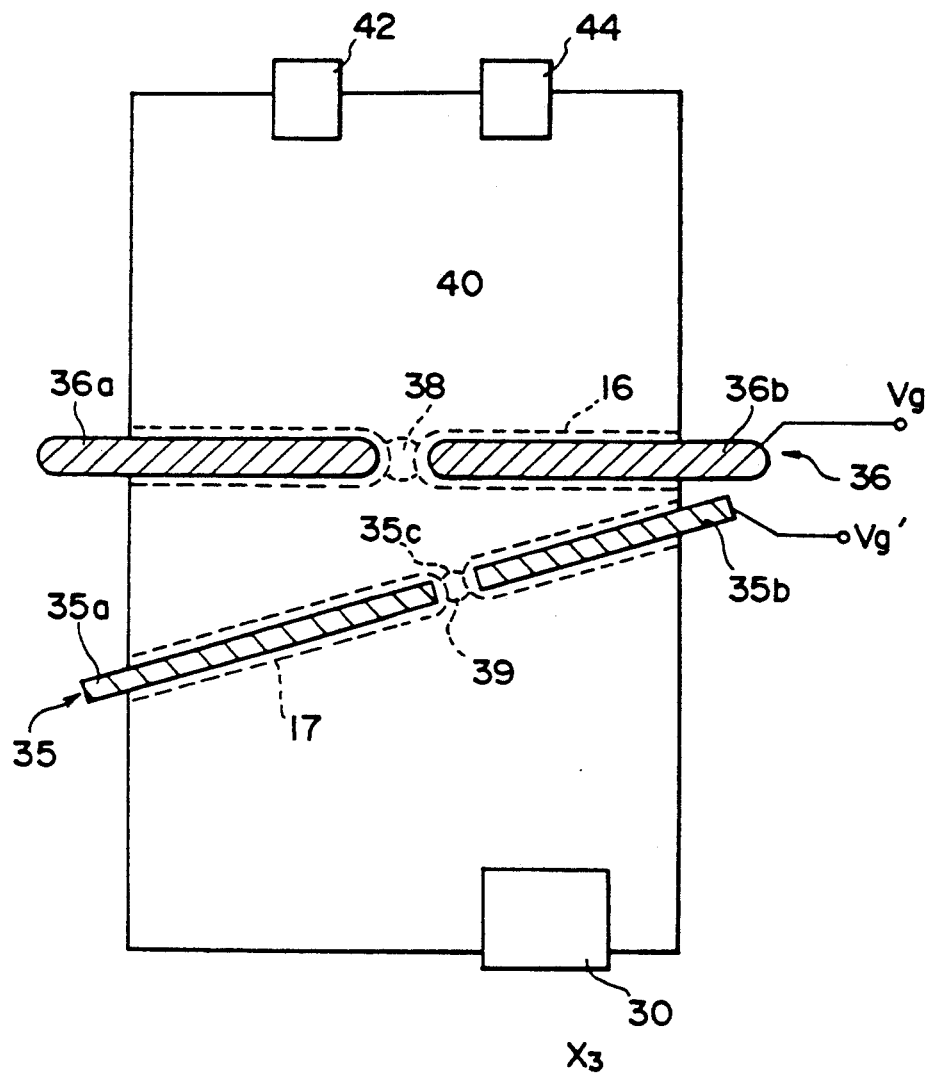
FIG. 15 is a diagram showing the quantum semiconductor device according to a third embodiment of the present invention in a plan view.

FIG. 15 is a diagram showing the quantum semiconductor device according to a third embodiment of the present invention.

Referring to FIG. 15, there is provided another Schottky electrode structure 35 on the upper major surface of the electron supplying layer 68 for forming a gap 35c between a Schottky electrode element 35a and another Schottky electrode element 35b. There, a depletion region 17 is formed in the two-dimensional electron gas and there is formed a quantum point contact 39 in correspondence to the gap 35c. The distance between the quantum point contact 39 and the quantum point contact 38 is set to be substantially smaller than the mean free path of the electron wave, for example at 4 μm.

Figure 16:
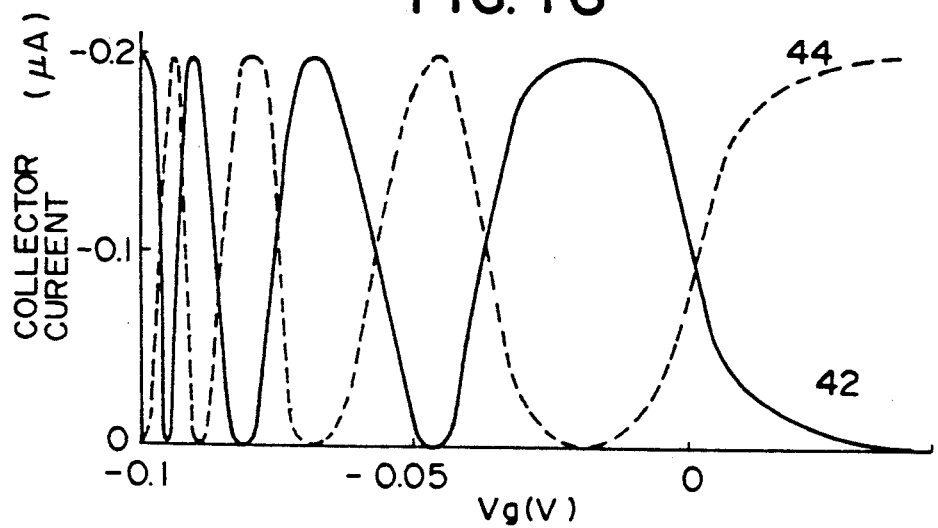
FIG. 16 is a diagram showing the operational characteristics of the device of FIG. 15.

Further, the emitter electrode 30 is provided generally in alignment with the quantum point contacts 38 and 39. By suitably applying a bias voltage $V_g'$ to the Schottky electrodes 35a and 35b such that the quantum state shown in FIG. 2(A) appears, the electrons that have exited from the quantum point contact enter straight into the quantum point contact 38 with a sharp directivity, and the output current that is obtained at the collector electrodes 42 and 44 in response to the output electron wave from the quantum point contact 39 increases significantly as shown in the characteristic diagram of FIG. 16. In FIG. 16, it will be noted that the output current detected at the collector electrodes 42 and 44 changes between 0. 0 μA and −0.2 μA when biased by an emitter-collector voltage $V_{EC}$ of 1.2 millivolts.

Next, the principle of the logic operation that can be achieved by the quantum semiconductor device of the present invention will be explained with reference to FIGS. 17(A) and 17(B) that correspond to FIGS. 4 and 7, respectively.

Figure 17A:
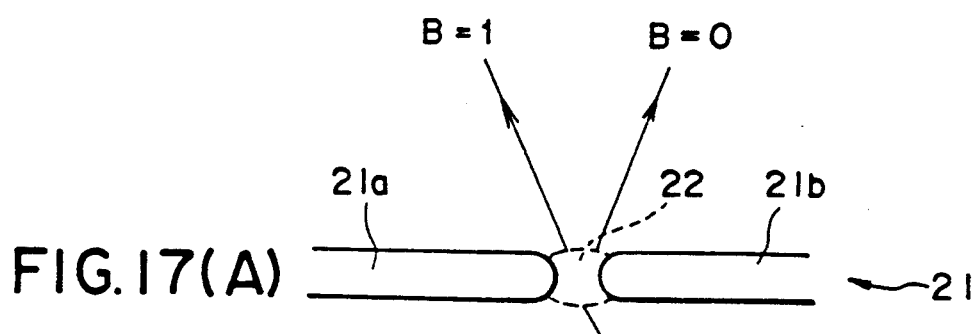
FIGS. 17(A) and 17(B) are diagrams showing the principle of the logic device that is realized by the quantum semiconductor device of the present invention.

Referring to FIG. 17(A) showing the case wherein the electron wave 23 enters into the quantum point contact 22 from the lower right direction, there can be two different output states in correspondence to FIGS. 6(A) and 6(B), one in which the strong electron wave is emitted substantially in the same direction as the direction of the incident electron wave 23, and the other in which the strong electron wave is emitted in a direction that is reversed with respect to the y-component. In FIG. 17(A), the input state of the electron beam 23 is represented as A=0, while the first output state is represented as B=1. Further, the second output state wherein the traveling direction of the y-component is reversed, is represented as B=0.

Figure 17B:
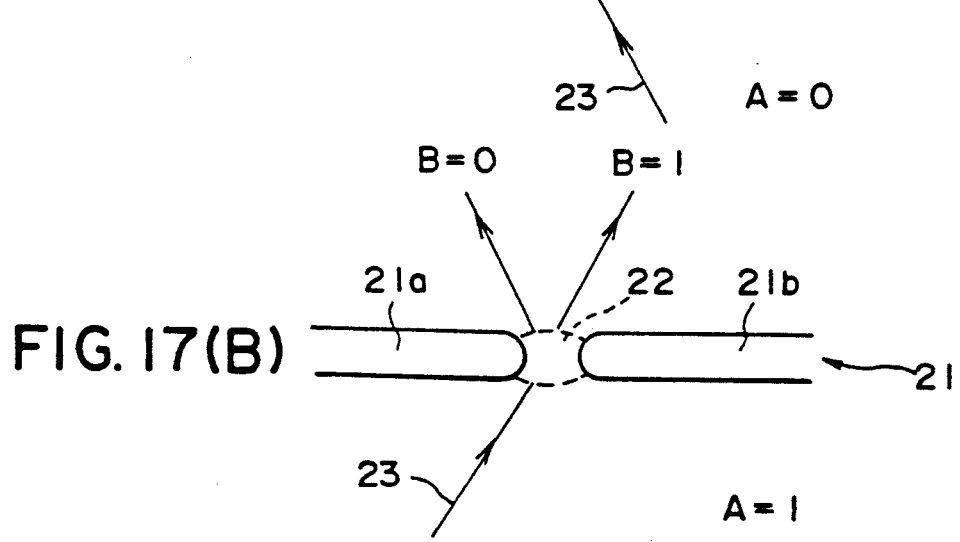

FIG. 17(B) shows, on the other hand, the case wherein the electron wave 23 enters into the quantum pint contact from the lower left direction in correspondence to FIG. 7. The input state for this case is represented as A=1. In this case, too, there are two output states, the one designated as B=1 in which the strong electron wave is emitted substantially in the same direction as the incident electron wave 23, and the other designated as B=0 in which the traveling direction of the electron beam is changed with respect to the y component.

Summarizing the above, it will be noted that there can be four distinct states, the first corresponding to A=1, B=1, the second corresponding to A=0, B=1, the third corresponding to A=1, B=0, and the fourth corresponding to A=0, B=0.

Figure 19:
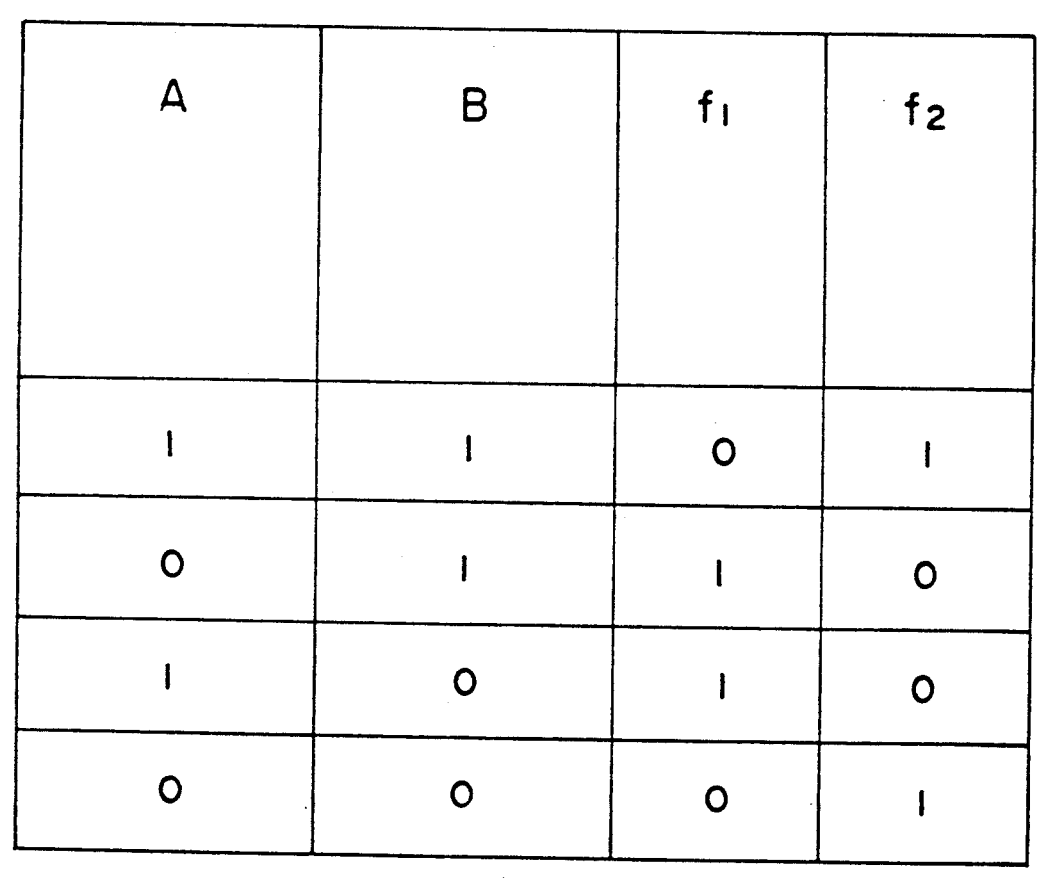

FIGS. 18(A)-18(D) represent the foregoing first through fourth states. Thus, by detecting the electron wave by the collector electrodes 42 and 44, one can operate the device according to the truth table shown in FIG. 19, wherein $f_1$ represents the output of the collector electrode 42 while $f_2$ represents the output of the collector electrode 44. It will be noted that the output $f_1$ represents the result of the Exclusive-OR operation, while the output $f_2$ represents the inversion of the EOR operation.

Figure 20:
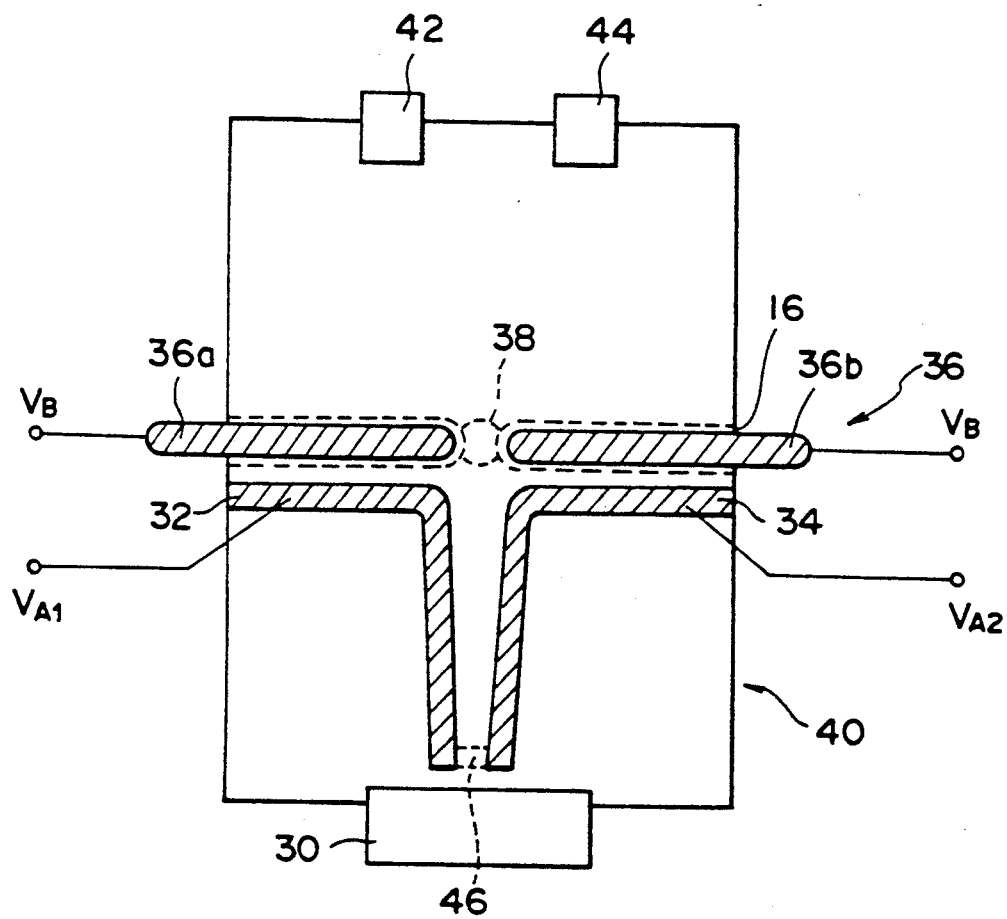
FIG. 20 is a diagram showing the quantum semiconductor logic device according to a fourth embodiment of the present invention.

FIG. 20 is a diagram showing the construction of the quantum semiconductor device according to a fourth embodiment. In FIG. 20, those parts that are constructed substantially the same as the device of FIG. 9 are designated by the same reference numerals and a description thereof will be omitted.

Referring to FIG. 20, there is provided another Schottky electrode 34 on the upper major surface of the electron supplying layer 68 in a manner symmetrical about the x-axis with respect to the Schottky electrode 32. It should be noted that the device of FIG. 20 uses a coordinate system identical with the device of FIG. 9. Further, in correspondence to the region located on the x-axis ($\theta_{in}=0$), there is provided a high resistivity region 46 in the channel layer 64 between the Schottky electrodes 32 and 34 for eliminating the electrons entering into the quantum point contact 38 directly from the emitter electrode 30. Such a region of high resistivity can be formed easily by an ion implantation of deep impurity elements such as oxygen. Other parts of the device of FIG. 20 are substantially identical with the device of FIG. 9 and further description will be omitted.

In operation, bias voltages $V_{A1}$ and $V_{A2}$ are applied to the electrodes 32 and 34 respectively as indicated in FIG. 20. Further, another bias voltage $V_B$ is applied to the Schottky electrodes 36a and 36b that form the electrode structure 36. By changing the bias voltages $V_{A1}$ and $V_{A2}$ simultaneously, one can realize the state shown in FIG. 21(A) that corresponds to the input state A=0 shown in FIG. 17(A), or the state shown in FIG. 21(B) that corresponds to the input state A=1 shown in FIG. 17(B).

Figure 21A:
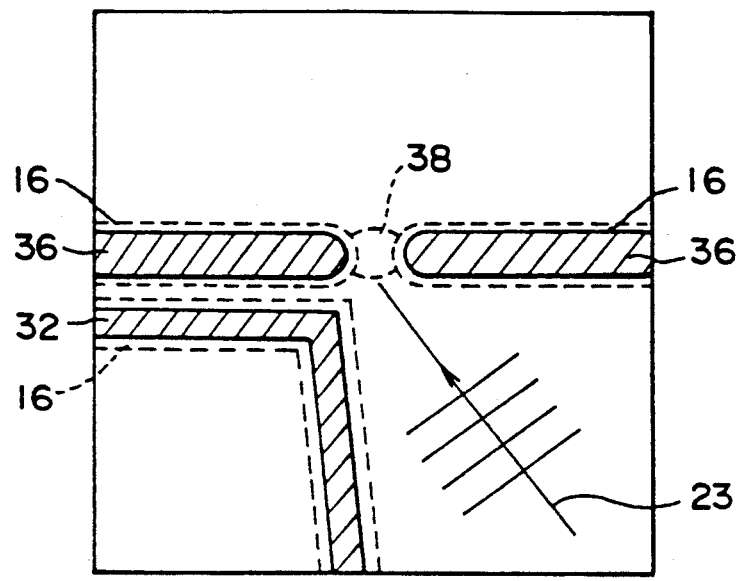
FIGS. 21(A) and 21(B) are diagrams showing the operation of the logic device of FIG. 20 in the two different states.
Figure 21B:
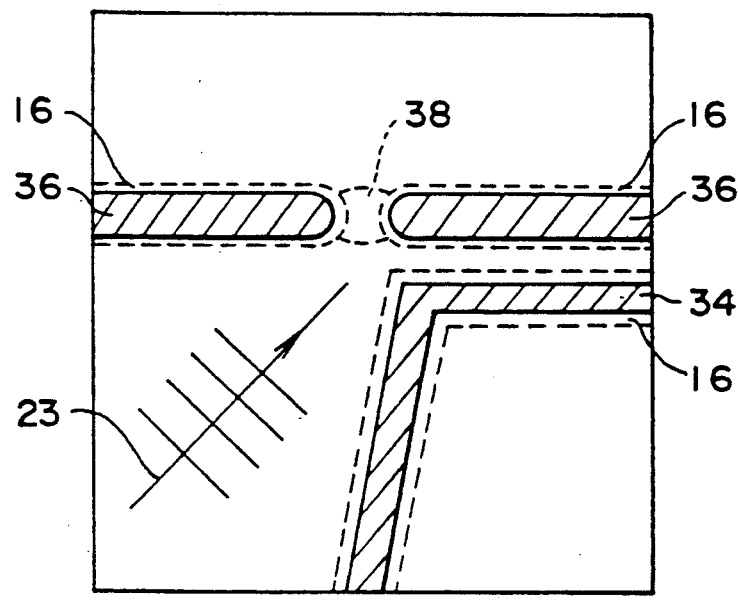
Figure 22A:
FIGS. 22(A)–22(D) are diagrams showing the waveform of input and output signals in the logic device of FIG. 20 for an EOR operation.
Figure 22B:
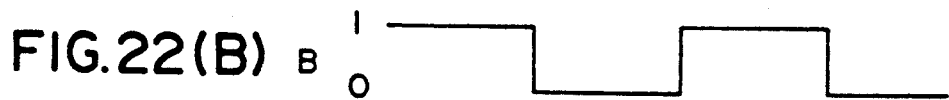
Figure 22C:
Figure 22D:

In FIG. 21(A), the electron wave 23 enters into the quantum point contact 38 from the lower right direction in correspondence to the bias voltage $V_{A1}$ set to −0.3 volts and the bias voltage $V_{A2}$ set to −0.2 volts. In order to illustrate the entrance, without interrupted by the Schottky electrodes 34, of the electron wave 23 into the quantum point contact 38, the illustration of the Schottky electrode 34 is omitted. In FIG. 21(B), on the other hand, the electron wave 23 enters into the quantum pint contact 38 from the lower left direction in correspondence to the bias voltage $V_{A1}$ set to −0.2 volts and the bias voltage $V_{A2}$ set to −0.3 volts. In FIG. 21(B), the illustration of the Schottky electrode 32 is similarly omitted.

By changing the bias voltage $V_B$ as shown in FIG. 12 in the input state of FIG. 21(A), one can obtain the output state shown in FIG. 18(B) or the output state shown in FIG. 18(D). On the other hand, the output state shown in FIG. 18(A) or FIG. 18(C) can be obtained by changing the bias voltage as shown in FIG. 12 while holding the input state of FIG. 21(B). Thus, by setting the bias voltage $V_B$ equal to about −0.07 volts in the state of FIG. 21(A), the emitter electrode 44 detects the output current in correspondence to the state of FIG. 18(D), while when the bias voltage $V_B$ is set to about −0.12 volts, the collector electrode 42 detects the output current in correspondence to the state of FIG. 18(B). On the other hand, when the bias voltage $V_B$ is set to about −0.07 volts in the state shown in FIG. 21(B), it will be noted that the collector electrode 42 detects the output current in correspondence to the state of FIG. 18(C). Further, when the bias voltage $V_B$ is set to about −0.12 volts in the state shown in FIG. 21(B), the collector electrode 44 detects the output current in correspondence to the state shown in FIG. 18(A).

FIGS. 22(A)–22(D) summarize the above operation, wherein it will be noted that one obtains a logic amplitude of about 0.05 mV in the output signal obtained at the collector electrode 42 or 44. As already noted, the output of the collector electrode 42 represents the result of the Exclusive-OR operation of the input logic signals A and B, while the output of the collector electrode 44 represents the logic inversion of the Exclusive-OR operation.

Figure 23:
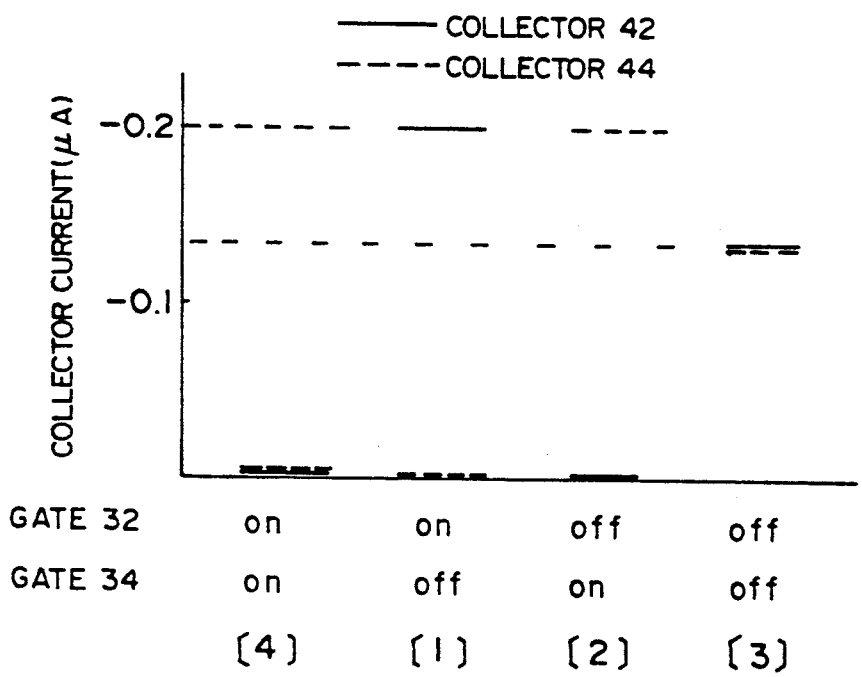
FIG. 23 is a diagram showing the output current of the logic device of FIG. 20 for a NAND operation.

FIG. 23 shows another example of the logic operation that is achieved by the device of FIG. 20.

In the present embodiment, the bias voltage $V_B$ to the Schottky electrodes 36a and 36b is fixed at a constant level such that the mode shown in FIG. 2(B) is realized in the quantum point contact. More specifically, the bias voltage $V_B$ to the Schottky electrodes 36a and 36b is fixed in correspondence to the state of B=1 shown in FIGS. 18(A) and 18(B). Under this state, the bias voltages to the Schottky electrodes 32 and 34 are changed according to various combinations.

Referring to FIG. 23, the state designated as [4] corresponds to a state wherein both the Schottky electrodes 32 and 33 are applied with the same bias voltage and the passage of the carriers to the quantum point contact 38 is interrupted by the depletion regions. In FIG. 23, this state is represented as GATE 32=ON, GATE 34=ON. In correspondence to the absence of the incoming electrons to the quantum point contact 38, the output currents at the collector electrode 42 and the collector electrode 44 are substantially zero.

In the state designated as [1], on the other hand, the Schottky electrodes 32 and 34 are biased such that while there is formed a depletion region in correspondence to the electrode 32, no such depletion region is formed in correspondence to the electrode 34. This state is designated as GATE 32=ON, GATE 34=OFF. In this case, the electron wave 23 enters into the quantum point contact 38 from the lower right direction and is detected by the collector electrode 42, while the collector electrode 44 produces no substantial output current.

In the state designated as [2], the Schottky electrodes 32 and 34 are biased oppositely to the state [1], and the electron wave 23 enters the quantum point contact 38 from the lower left direction and exits in the upper right direction in correspondence to the state shown in FIG. 18(A). Thereby, the collector electrode 44 detects the output current while the collector electrode 42 detects no substantial output current. Further, in the state designated as [3], the Schottky electrodes 32 and 34 are both biased such that no substantial Schottky barriers are formed in correspondence to the electrodes 32 and 34. In this state, the electron wave 23 enters into the quantum point contact 38 from both directions and exits in two directions, one corresponding to the collector electrode 42 and the other corresponding to the collector electrode 44. Thereby, both the collector electrode 42 and the collector electrode 44 produce the output current.

In the operation shown in FIG. 23, it will be noted that one obtains an OR operation when the output from the two collector electrodes 42 and 44 are used together. Further, it should be noted that the operation according to the present embodiment shows a tri-state output. Thereby, one can switch the output of the device between the collector electrode 42 and the collector electrode 44 in response to the bias voltage applied to the Schottky electrodes 32 and 34.

Figure 24A:
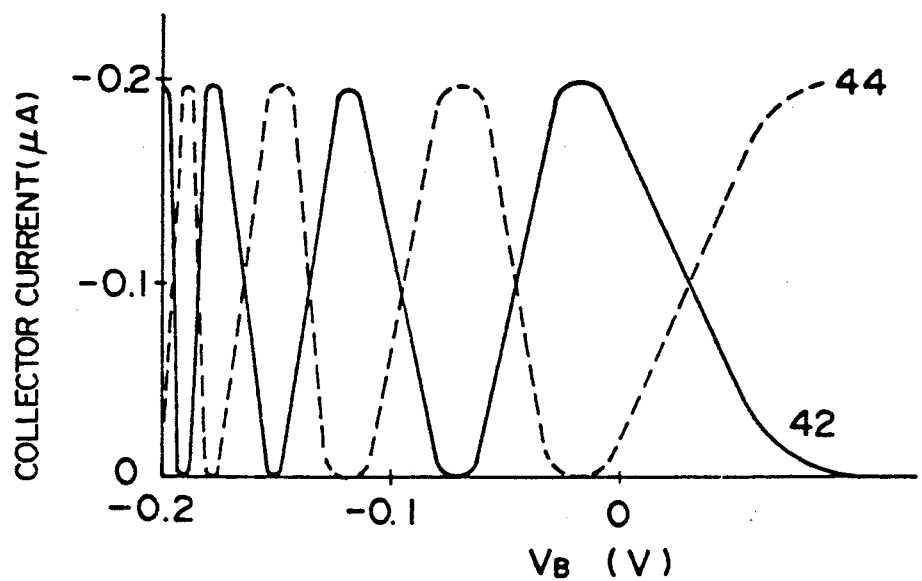
FIGS. 24(A) and 24(B) are the diagrams showing the waveform of the output signals in the logic operation achieved by the quantum semiconductor logic device of FIG. 20.
Figure 24B:
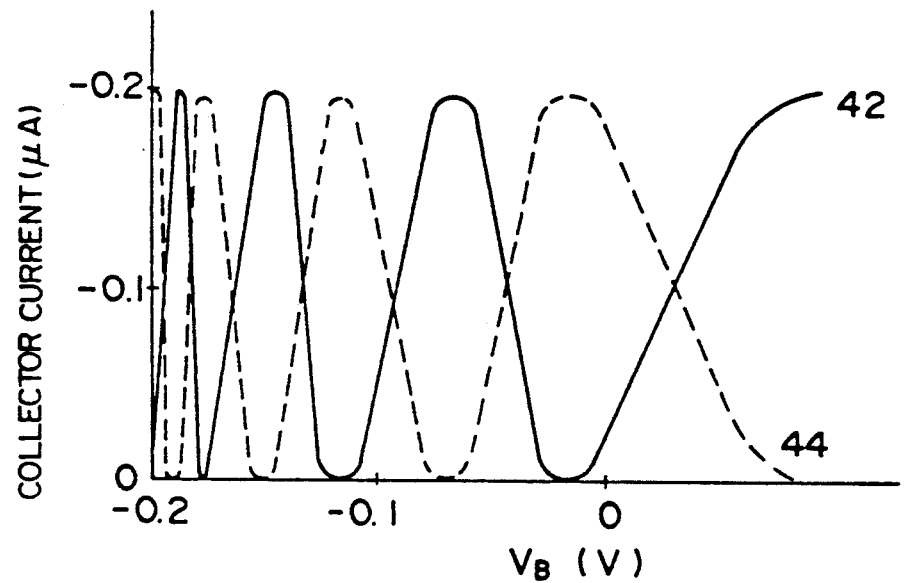

FIGS. 24(A) and 24(B) show the other example of the logic operation achieved by the quantum semiconductor device of FIG. 20, wherein the output current is switched between the collector electrode 42 and the collector electrode 44 in response to the bias voltage applied to the Schottky electrodes 32 and 34. There, FIG. 24(A) corresponds to the state of FIG. 17(A) wherein the electron wave 23 enters into the quantum point contact 22 from the lower right direction, while FIG. 24(B) corresponds to the state of FIG. 17(B) wherein the electron wave 23 enters into the quantum point contact 22 from the lower left direction. It should be noted that the relationship between the output current obtained at the collector electrode 42 and the output current obtained at the collector electrode 44 are inverted with respect to each other in the setting of FIG. 24(A) and in the setting of FIG. 24(B) for each given bias voltage $V_B$. Thus, by merely changing the bias voltage to the Schottky electrodes 32 and 33 while maintaining the bias voltage $V_B$ constant, one can switch the output of the quantum semiconductor device of FIG. 20 between the collector electrode 42 and the collector electrode 44.

In the embodiments described heretofore, it should be noted that one may use a two-dimensional hole gas in place of the two-dimensional electron gas. Further, the epitaxial structure for producing the two-dimensional electron gas in the semiconductor layered body 40 is not limited to the heterojunction of GaAs and AlGaAs but a heterojunction of other combinations such as InAs and InAlAs may also be employed.

Further, the present invention is not limited to the embodiments described heretofore, but various variations and modifications may be made without departing from the scope of the invention.

What is claimed is:

1. A quantum semiconductor device for switching a quantum mechanical wave of carriers, comprising:

a channel region having an upper major surface and formed therein with a two-dimensional carrier gas, said two-dimensional carrier gas comprising carriers confined substantially on a plane that extends in a lateral direction and in a longitudinal direction perpendicular to said lateral direction, said upper major surface extending in said lateral direction and in said longitudinal direction;

barrier means provided on said upper major surface of said channel region to extend in said lateral direction for dividing said channel region into a first channel area and a second channel area such that said first channel area and said second channel area are separated from each other in said longitudinal direction, said barrier means producing a depletion region such that the depletion region extends in said lateral direction in correspondence to said barrier means such that the depletion region divides said two-dimensional carrier gas into a first carrier gas region corresponding to said first channel area and a second carrier gas region corresponding to said second channel area, by rejecting said carriers from said depletion region;

a quantum point contact formed in said barrier region as a quantum well that connects said first carrier gas region and said second carrier gas region with each other in said longitudinal direction, said quantum well being defined laterally by said depletion region and having a lateral size equal to or smaller than a de Broglie length of said carriers in said two-dimensional carrier gas, said quantum point contact having a longitudinal size set smaller than any of elastic and inelastic scattering lengths of said carriers in said two-dimensional carrier gas, said quantum point contact allowing a passage of the carriers in the form of a quantum mechanical wave between said first and second carrier gas regions and emitting said quantum mechanical wave with a predetermined directivity that is determined by said lateral size of said quantum well;

carrier injection means provided on said upper major surface of said first channel area for injecting said carriers into said two-dimensional carrier gas in correspondence to said first carrier gas region;

carrier collection means provided on said upper major surface of said second channel area in correspondence to said second carrier gas region, for collecting said carriers from said two-dimensional carrier gas, said carrier collection means being provided on said second channel area at a predetermined location selected in correspondence to said directivity of said quantum mechanical wave for receiving said carriers that are emitted from said quantum point contact; and carrier path control means provided on said upper major surface of said channel region in correspondence to said first channel area for controlling a flow of the carriers that are injected by said carrier injection means and entering into said quantum point contact, such that the carriers enter into said quantum point contact asymmetrically with respect to a hypothetical longitudinal axis that is set to pass through a center of said quantum point contact in said longitudinal direction.

2. A quantum semiconductor device as claimed in claim 1 in which said hypothetical longitudinal axis divides said first channel area into a first sub-area and a second sub-area, wherein said carrier injection means comprises an ohmic electrode provided on said upper major surface of said channel region in correspondence to said first sub-area in ohmic contact therewith, while said carrier path control means is provided on said second sub-area, said carrier path control means producing a depletion region in said second sub-area such that said two-dimensional carrier gas is rejected from said second sub-area.

3. A quantum semiconductor device as claimed in claim 2 in which said carrier path control means comprises a Schottky electrode provided on said upper major surface of said channel region to establish a Schottky contact, said Schottky electrode being supplied with a bias voltage for inducing said depletion region in said second sub-area in response to said bias voltage.

4. A quantum semiconductor device as claimed in claim 3 in which said Schottky electrode is provided to extend along a boundary of said second sub-area to said first sub-area and further along a boundary between said first channel area and said barrier means.

5. A quantum semiconductor device as claimed in claim 3 in which said Schottky electrode covers said second sub-area substantially.

6. A quantum semiconductor device as claimed in claim 1 in which said barrier means comprises a Schottky electrode supplied with an input signal for producing said depletion region in response thereto such that said lateral size of said quantum point changes in response to said input signal.

7. A quantum semiconductor device as claimed in claim 1 in which said hypothetical longitudinal axis divides said first channel area into a first sub-area and a second sub-area, wherein said carrier injection means comprises an ohmic electrode provided on said upper major surface of said channel region in correspondence to said first sub-area for establishing an ohmic contact, while said carrier path control means is provided on said first sub-area between said carrier injection means and said quantum point contact for accelerating carriers in a direction pointing to said quantum point contact.

8. A quantum semiconductor device as claimed in claim 7 in which said carrier path control means comprises a Schottky electrode for producing a depletion region for preventing the carriers from flowing to said quantum point contact, and a second quantum point contact provided in alignment with said first quantum point contact and said ohmic electrode for causing said accelerating of the carriers.

9. A quantum semiconductor logic device for achieving a logic operation in response to a combination of input signals, comprising:

a channel region having an upper major surface and formed therein with a two-dimensional carrier gas, said two-dimensional carrier gas comprising carriers confined substantially on a plane that extends in a lateral direction and in a longitudinal direction, said upper major surface extending in said lateral direction and in said longitudinal direction;

barrier means provided on said upper major surface of said channel region to extend in said lateral direction for dividing said channel region into a first channel area and a second channel area such that said first channel area and said second channel area are separated from each other in said longitudinal direction, said barrier means producing a depletion region such that the depletion region extends in said lateral direction in correspondence to said barrier means such that the depletion region divides said two-dimensional carrier gas into a first carrier gas region corresponding to said first channel area and a second carrier gas region corresponding to said second channel area, by rejecting said carriers from said depletion region;

a quantum point contact formed in said barrier region as a quantum well that connects said first carrier gas region and said second carrier gas region with each other in said longitudinal direction, said quantum well being defined laterally by said depletion region and having a lateral size equal to or smaller than a de Broglie length of said carriers in said two-dimensional carrier gas, said quantum point contact having a longitudinal size set smaller than any of elastic and inelastic scattering lengths of said carriers in said two-dimensional carrier gas, said quantum point contact allowing a passage of the carriers in the form of a quantum mechanical wave between said first and second carrier gas regions and emitting said quantum mechanical wave with a predetermined directivity that is determined by said lateral size of said quantum well;

carrier injection means provided on said upper major surface of said first channel area for injecting said carriers into said two-dimensional carrier gas in correspondence to said first carrier gas region;

carrier collection means provided on said upper major surface of said second channel area in correspondence to said second carrier gas region, for collecting said carriers from said two-dimensional carrier gas, said carrier collection means being provided on said second channel area at a predetermined location selected in correspondence to said directivity of said quantum mechanical wave for receiving said carriers that are emitted from said quantum point contact, said carrier collection means producing an output signal in response to a reception of said quantum mechanical wave; and carrier path control means provided on said upper major surface of said channel region in correspondence to said first channel area for controlling a flow of the carriers that are injected by said carrier injection means and entering into said quantum point contact, such that the carriers enter into said quantum point contact with a controlled direction with respect to a hypothetical longitudinal axis that is set to pass through a center of said quantum point contact in said longitudinal direction, said hypothetical longitudinal axis thereby dividing said first channel area into a first sub-area and a second sub-area, said carrier path control means comprising first and second Schottky electrodes provided on said upper major surface of said channel region respectively in correspondence to said first sub-area and said second sub-area, to establish a Schottky contact therewith, said first and second Schottky electrodes being supplied with an input voltage signal such that said input voltage signal is applied across said first and second Schottky electrodes, for inducing respective depletion regions in said first and second sub-areas in response to said input voltage signal, said Schottky electrodes thereby controlling the direction of the carriers entering into the quantum point contact.

10. A semiconductor logic device as claimed in claim 9 in which said barrier means comprises third and fourth Schottky electrodes extending in said lateral direction with a gap formed therebetween in correspondence to said quantum point contact, said third and fourth Schottky electrodes being applied with a second input voltage signal for inducing said depletion region that defines said quantum well forming the quantum point contact.

11. A method for achieving a logic operation in a quantum semiconductor device having a quantum point contact, said quantum point contact comprising a quantum well formed between a pair of depletion regions that in turn are created by a pair of Schottky electrodes opposite to each other in a lateral direction, said quantum point contact passing carriers as quantum mechanical waves in a longitudinal direction that is perpendicular to said lateral direction, said method comprising the steps of:

applying a predetermined bias voltage to said pair of Schottky electrodes such that said quantum mechanical wave is radiated from said quantum point contact with a predetermined radiation pattern;

injecting carriers into said quantum point contact with an incidence direction, defined with respect to a hypothetical longitudinal axis that passes through said quantum point contact in said longitudinal direction, such that said incidence direction is determined by a first input voltage signal; and detecting said quantum mechanical wave radiated from said quantum point contact;

said step of injecting carriers comprising a step of controlling a path of the carriers traveling toward said quantum point contact by applying said first input voltage signal to a Schottky electrode such that a depletion region is formed to block the carriers except for those from a predetermined incidence direction.

12. A method as claimed in claim 11 in which said method further comprises a step of applying a second input voltage signal to said Schottky electrodes such that said predetermined radiation pattern of the quantum mechanical wave is changed.

13. A method as claimed in claim 11 in which said step of detecting said quantum mechanical wave comprises a step of detecting an output current by an electrode that is provided in correspondence to said predetermined radiation pattern.

* * * * *